US006780567B2

(12) United States Patent
Makino et al.

(10) Patent No.: US 6,780,567 B2
(45) Date of Patent: Aug. 24, 2004

(54) LITHOGRAPHIC PROCESS USING REACTION OF O-QUINODIMETHANE

(75) Inventors: Naonori Makino, Shizuoka (JP); Hidekazu Oohashi, Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 2 days.

(21) Appl. No.: 10/189,551

(22) Filed: Jul. 8, 2002

(65) Prior Publication Data

US 2003/0165778 A1 Sep. 4, 2003

(30) Foreign Application Priority Data

Aug. 2, 2001 (JP) ....................................... 2001-234969
Dec. 18, 2001 (JP) ....................................... 2001-384096
Apr. 1, 2002 (JP) ....................................... 2002-099151

(51) Int. Cl.[7] ............................ G03F 7/038; G03F 7/26

(52) U.S. Cl. .................... 430/302; 430/138; 430/270.1; 430/281.1; 430/286.1; 430/309; 430/401; 430/434; 430/494; 430/944; 430/945; 101/463.1; 101/465; 101/467

(58) Field of Search .............................. 101/463.1, 465, 101/467; 430/138, 270.1, 281.1, 286.1, 302, 306, 309, 348, 401, 434, 494, 944, 945

(56) References Cited

U.S. PATENT DOCUMENTS 6,083,661 A * 7/2000 Oaks et al. .............. 430/286.1
6,514,671 B1 * 2/2003 Parikh et al. ............... 430/313
2003/0039443 A1 * 2/2003 Catchmark et al. ........... 385/37
2003/0087191 A1 * 5/2003 Lavallee et al. ............ 430/296

* cited by examiner

*Primary Examiner*—Barbara Gilliam
(74) *Attorney, Agent, or Firm*—Burns, Doane, Swecker & Mathis, L.L.P.

(57) ABSTRACT

A lithographic process comprises the steps of imagewise heating a presensitized lithographic printing plate and removing an unheated area of an image-forming layer to form a lithographic printing plate. The presensitized lithographic printing plate comprises a hydrophilic support and the image-forming layer. The image-forming layer contains a compound or a polymer having o-quinodimethane structures or precursor structures thereof. The lithographic printing plate is prepared by a reaction of the o-quinodimethane structures.

19 Claims, No Drawings

LITHOGRAPHIC PROCESS USING REACTION OF O-QUINODIMETHANE

FIELD OF THE INVENTION

The present invention relates to a lithographic process of forming a lithographic printing plate. In more detail, the invention relates to a lithographic process of scanning a presensitized lithographic plate with a laser beam according to digital signals to form a lithographic printing plate.

BACKGROUND OF THE INVENTION

A lithographic printing plate generally comprises a hydrophobic imaging area, which receives oily ink in a printing process, and a hydrophilic non-imaging area, which receives dampening water. A conventional lithographic process usually comprises the steps of masking a presensitized (PS) plate comprising a hydrophilic support and a hydrophobic photosensitive resin layer with a lith film, exposing the plate to light through the lith film, and then dissolving and removing a non-imaging area with a developing solution.

Nowadays a computer electronically processes, stores and outputs image information as digital data. An image according to the digital data is preferably formed by directly scanning a presensitized lithographic plate with a highly directive active radiation such as a laser beam without use of a lith film. The lithographic process of forming a printing plate according to digital image data without use of a lith film is referred to as Computer to Plate (CTP).

The conventional lithographic process of forming a printing plate has a problem about CTP that a wavelength region of a laser beam does not match a spectral sensitivity of a photosensitive resin.

The conventional PS plate requires a step of dissolving and removing a non-imaging area (namely, developing step). The developed printing plate should be further subjected to post-treatments such as a washing treatment using water, a rinsing treatment using a solution of a surface active agent, and a desensitizing treatment using a solution of gum arabic or a starch derivative. The additional wet treatments are disadvantageous to the conventional PS plate. Even if an early step (image-forming step) in a lithographic process is simplified according to a digital treatment, the late step (developing step) comprises such troublesome wet treatments that the process as a whole cannot be sufficiently simplified.

The printing industry as well as other industries is interested in protection of global environment. Wet treatments inevitably influence global environment. The wet treatments are preferably simplified, changed into dry treatments or omitted from a lithographic process to protect global environment.

A process without wet treatments is referred to as a press development method, which comprises the steps of attaching an exposed presensitized printing plate to a cylinder of a printer, and rotating the cylinder while supplying dampening water and ink to the plate to remove a non-imaging area from the plate. Immediately after exposing the presensitized plate to light, the plate can be installed in a printer. A lithographic process can be completed while conducting an usual printing treatment.

A presensitized lithographic printing plate suitable for the press development method must have a photosensitive layer soluble in dampening water or a solvent of ink. The presensitized plate should easily be treated under room light to be subjected to a press development in a printer placed under room light.

A conventional PS plate cannot satisfy the above-described requirements.

Japanese Patent No. 2,938,397 (corresponding to European Patent No. 0770494, and U.S. Pat. Nos. 6,030,750 and 6,096,481) discloses a method for making a lithographic printing plate. The method uses an imaging element (presensitized plate) comprising on a hydrophilic surface of a lithographic based an image forming layer comprising hydrophobic thermoplastic polymer particles capable of coalescing under the influence of heat and dispersed in a hydrophilic binder and a compound capable of converting light to heat. The method comprising the steps of imagewise exposing to light the imaging element; and developing a thus obtained imagewise exposed imaging element by mounting it on a print cylinder of a printing press and supplying an aqueous dampening liquid or ink to the image forming layer while rotating the printer cylinder.

The imaging element can be treated under room light because the element has sensitivity within an infrared region.

In the method for making a lithographic printing plate, polymer particles coalesce under the influence of heat converted from light. Imaging elements having particles suitable for a press development often show poor plate wear. On the other hand, imaging elements showing good plate wear often cause troubles at a press development or stains in a printed sheet. Therefore, it is difficult to form a printing plate improved in plate wear according to a press development.

SUMMARY OF THE INVENTION

An object of the present invention is to provide a lithographic printing plate improved in plate wear.

Another object of the invention is to provide a presensitized lithographic printing plate improved in sensitivity and resolution.

The first embodiment of the present invention provides a lithographic process comprising the steps of: imagewise heating a presensitized lithographic printing plate which comprises a hydrophilic support and an image-forming layer containing a hydrophobic polymer and a compound having two or more o-quinodimethane structures or precursor structures thereof to polymerize the compound; and removing the unheated area of the image-forming layer to form a lithographic printing plate.

The first embodiment of the invention also provides a lithographic process comprising the steps of: imagewise heating a presensitized lithographic printing plate which comprises a hydrophilic support and an image-forming layer containing a hydrophilic polymer and a compound having two or more o-quinodimethane structures or precursor structures thereof, said compound being contained in particles dispersed in the hydrophilic polymer to polymerize the compound and to fuse the particles together; and removing the unheated area of the image-forming layer to form a lithographic printing plate.

The first embodiment of the invention further provides a lithographic printing process comprising the steps of: imagewise heating a presensitized lithographic printing plate which comprises a hydrophilic support and an image-forming layer containing a hydrophilic polymer and a compound having two or more o-quinodimethane structures or precursor structures thereof, said compound being contained in particles dispersed in the hydrophilic polymer to polymerize the compound and to fuse the particles together; attaching the plate to a printer; working the printer to remove the unheated area of the image-forming layer and to form a lithographic printing plate; and printing with the formed plate by supplying oily ink and dampening water to the plate.

The first embodiment of the invention furthermore provides a presensitized lithographic printing plate which comprises a hydrophilic support and an image-forming layer containing a hydrophobic polymer and a compound having two or more o-quinodimethane structures or precursor structures thereof.

The first embodiment of the invention still further-more provides a presensitized lithographic printing plate which comprises a hydrophilic support and an image-forming layer containing a hydrophilic polymer and a compound having two or more o-quinodimethane structures or precursor structures thereof, said compound being contained in particles dispersed in the hydrophilic polymer.

The second embodiment of the present invention provides a lithographic process comprising the steps of: imagewise heating a presensitized lithographic printing plate which comprises a hydrophilic support and an image-forming layer containing a hydrophobic polymer having o-quinodimethane structures or precursor structures thereof to cross-link the hydrophobic polymer; and removing the un-heated area of the image-forming layer to form a lithographic printing plate.

The second embodiment of the invention also provides a lithographic printing process comprising the steps of: imagewise heating a presensitized lithographic printing plate which comprises a hydrophilic support and an image-forming layer containing a hydrophilic polymer and a hydrophobic polymer having o-quinodimethane structures or precursor structures thereof, said hydrophobic polymer being contained in particles dispersed in the hydrophilic polymer to cross-link the hydrophobic polymer and to fuse the particles together; attaching the plate to a printer; working the printer to remove the unheated area of the image-forming layer and to form a lithographic printing plate; and printing with the formed plate by supplying oily ink and dampening water to the plate.

The second embodiment of the invention further provides a presensitized lithographic printing plate which comprises a hydrophilic support and an image-forming layer containing a hydrophobic polymer having o-quinodimethane structures or precursor structures thereof.

The lithographic process of the present invention uses a reaction of o-quinodimethane structures contained in a compound (first embodiment) or a polymer (second embodiment). The reaction of the o-quinodimethane structures is hardly inhibited by oxygen in air, while a conventional image forming reaction (such as a polymerization reaction of an ethylenically unsaturated monomer) is remarkably inhibited by oxygen. Therefore, the lithographic process of the invention can form a lithographic printing plate showing excellent plate wear.

DETAILED DESCRIPTION OF THE INVENTION

[Compound Having o-quinodimethane Structures or Precursor Structures Thereof]

The present invention uses a compound containing two or more o-quinodimethane structures or precursor structures thereof (first embodiment). The compound can be in the form of a polymer containing o-quinodimethane structures or precursor structures thereof (second embodiment). The o-quinodimethane structure is represented by the following formula.

(o-Quinodimethane structure)

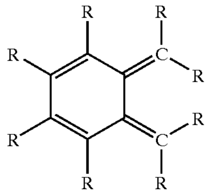

In the formula, each of the groups represented by R independently is hydrogen or a monovalent group.

In a compound having two or more o-quinodimethane structures, at least one group of R connects to a linking group, which further connects to other o-quinodimethane structures.

In a polymer having o-quinodimethane structures, at least one group of R connects to a main chain of the polymer.

A precursor structure of the o-quinodimethane structure is preferred to the o-quinodimethane structure itself because the o-quinodimethane structure is highly active. The precursor structure can change into o-quinodimethane structure through some reactions. The precursor structure preferably changes into o-quinodimethane structure by heating, since a presensitized lithographic printing plate is imagewise heated at a lithographic process. A benzocyclobutene structure is a particularly preferred precursor structure. The benzocyclobutene structure changes into the o-quinodimethane structure by heating according to the following formula.

(Benzocyclobutene) (o-Quinodimethane)

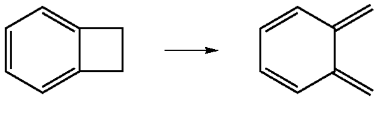

Two o-quinodimethane structures can be combined with each other by a dimerization reaction. Accordingly, a compound having two or more o-quinodimethane structures or precursor structures thereof can be polymerized by the dimerization reaction. Further, a polymer having quinodimethane structures or precursor structures thereof can be cross-linked by the dimerization reaction. In dimerization reactions shown below, two o-quinodimethane structures form a cyclooctadiene ring (b1) or a spiro bond (b2) through an intermediate (a). The o-quinodimethane structures can also be polymerized (b3) through the intermediate (a).

(Dimerization Reactions)

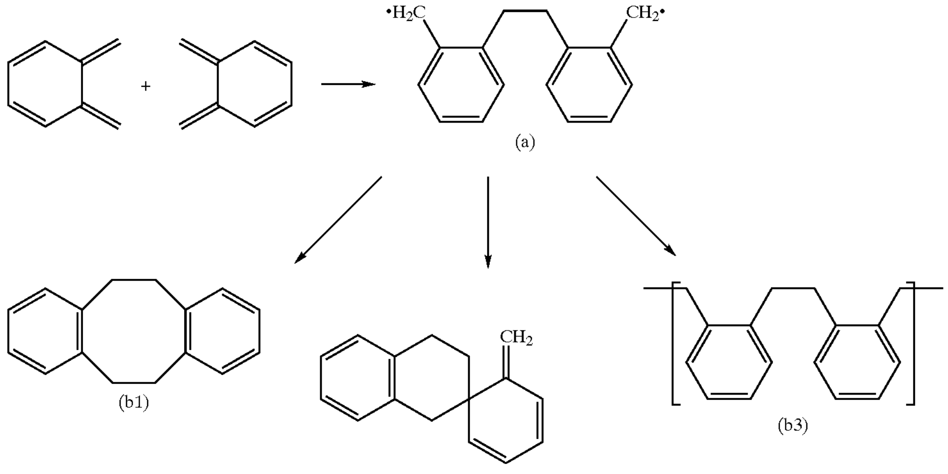

(a) (b1) (b2) (b3)

The o-quinodimethane structures can also be combined with each other by a Diels-Alder reaction. Accordingly, a compound having two or more o-quinodimethane structures or precursor structures thereof can be polymerized by the Diels-Alder reaction of the compound with a compound or polymer having two or more dienophile structures. Further, a polymer having o-quinodimethane structures or precursor structures thereof can be cross-linked by the Diels-Alder reaction of the polymer with a compound or polymer having two or more dienophile structures. In the Diels-Alder reaction shown below, two o-quinodimethane structures react with a compound having two or more dienophile structures (c) to be combined with each other (d) by forming two cyclohexene rings. The compound (c) in the following formula is a compound having two dienophile structures, and the group of L a divalent linking group.

(Diels-Alder Reaction)

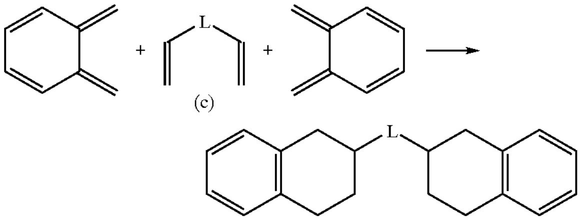

(c) (d)

The compound preferably has two or more benzocyclobutene structures as the precursor structures of the o-quinodimethane structures. The compound having two or more benzocyclobutene structures is preferably represented by the formula (I).

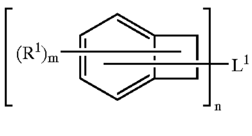

(I)

In the formula (I), $R^1$ is a substituent group of the benzocyclobutene ring, and m is 0, 1, 2, 3, 4 or 5.

Examples of the substituent groups include a halogen atom (F, Cl, Br, I), amino, ammonio, hydroxyl, mercapto, carboxyl, sulfo, a sulfuric ester group, phosphono, a phosphoric ester group, cyano, carbamoyl, a monovalent aliphatic group, a monovalent aromatic group, a monovalent heterocyclic group, —O—R, —S—R, —CO—R, —NH—R, —N(—R)$_2$, —N$^+$H$_2$—R, —N$^+$H(—R)$_2$, —N$^+$(—R)$_3$, —CO—O—R, —O—CO—R, —CO—NH—R, —CO—N(—R)$_2$, —NH—CO—R, —N(—R)—CO—R, —P(=O)(—OH)—O—R and —P(=O)(—O—R)$_2$. Each of the groups represented by R independently is a monovalent aliphatic group, a monovalent aromatic group or a monovalent heterocyclic group. Carboxyl, sulfo, the sulfuric ester group, phosphono and the phosphoric ester group can be dissociated, or can be in the form of a salt.

The substituent group of the benzocyclobutene ring preferably is a halogen atom, amino, a monovalent aliphatic group, a monovalent aromatic group, —O—R, —S—R, —CO—R, —NH—R, —N(—R)$_2$ or —NH—CO—R.

In the present specification, the aliphatic group can have a cyclic structure or a branched structure. The cyclic structure can be condensed with another aliphatic ring, an aromatic ring or a heterocyclic ring. The aliphatic group preferably has 1 to 40 carbon atoms, more preferably has 1 to 30 carbon atoms, further preferably has 1 to 20 carbon atoms, furthermore preferably has 1 to 15 carbon atoms, and most preferably has 1 to 12 carbon atoms.

The aliphatic group can have a substituent group. Examples of the substituent groups include a halogen atom (F, Cl, Br, I), amino, ammonio, hydroxyl, mercapto, carboxyl, sulfo, a sulfuric ester group, phosphono, a phosphoric ester group, cyano, carbamoyl, a monovalent aromatic group, a monovalent heterocyclic group, —O—R, —S—R, —CO—R, —NH—R, —N(—R)$_2$, —N$^+$H$_2$—R, —N$^+$H(—R)$_2$, —N$^+$(—R)$_3$, —CO—O—R, —O—CO—R, —CO—NH—R, —CO—N(—R)$_2$, —NH—CO—R, —N(—R)—CO—R, —P(=O)(—OH)—O—R and —P(=O)(—O—R)$_2$. Each of the groups represented by R independently is a monovalent aliphatic group, a monovalent aromatic group or a monovalent heterocyclic group.

Carboxyl, sulfo, the sulfuric ester group, phosphono and the phosphoric ester group can be dissociated, or can be in the form of a salt.

In the present specification, the monovalent aliphatic group means an alkyl group, a substituted alkyl group, a alkenyl group, a substituted alkenyl group, an alkynyl group or a substituted alkynyl group.

The aromatic group has an aromatic ring, which can be condensed with an aliphatic ring or a heterocyclic ring.

The aromatic group can have a substituent group. Examples of the substituent groups include a halogen atom (F, Cl, Br, I), amino, ammonio, hydroxyl, mercapto, carboxyl, sulfo, a sulfuric ester group, phosphono, a phosphoric ester group, cyano, carbamoyl, a monovalent aliphatic group, a monovalent aromatic group, a monovalent heterocyclic group, —O—R, —S—R, —CO—R, —NH—R, $—N(—R)_2$, $—N^+H_2—R$, $—N^+H(—R)_2$, $—N^+(—R)_3$, —CO—O—R, —O—CO—R, —CO—NH—R, $—CO—N(—R)_2$, —NH—CO—R, —N(—R)—CO—R, —P(=O)(—OH)—O—R and $—P(=O)(—O—R)_2$. Each of the groups represented by R independently is a monovalent aliphatic group, a monovalent aromatic group or a monovalent heterocyclic group. Carboxyl, sulfo, the sulfuric ester group, phosphono and the phosphoric ester group can be dissociated, or can be in the form of a salt.

In the present specification, the monovalent aromatic group means an aryl group or a substituted aryl group.

The heterocyclic group has a heterocyclic ring, which can be condensed with another heterocyclic ring, an aliphatic ring or an aromatic ring.

The heterocyclic ring preferably is a three-membered to seven-membered ring. The hetero atom of the ring preferably is nitrogen, oxygen or sulfur.

The heterocyclic group can have a substituent group. Examples of the substituent groups include a halogen atom (F, Cl, Br, I), amino, ammonio, hydroxyl, mercapto, carboxyl, sulfo, a sulfuric ester group, phosphono, a phosphoric ester group, cyano, carbamoyl, oxo (=O), thio (=S), a monovalent aliphatic group, a monovalent aromatic group, a monovalent heterocyclic group, —O—R, —S—R, —CO—R, —NH—R, $—N(—R)_2$, $—N^+H_2—R$, $—N^+H(—R)_2$, $—N^+(—R)_3$, —CO—O—R, O—CO—R, —CO—NH—R, $—CO—N(—R)_2$, —NH—CO—R, —N(—R)—CO—R, —P(=O)(—OH)—O—R and $—P(=O)(—O—R)_2$. Each of the groups represented by R independently is a monovalent aliphatic group, a monovalent aromatic group or a monovalent heterocyclic group. Carboxyl, sulfo, the sulfuric ester group, phosphono and the phosphoric ester group can be dissociated, or can be in the form of a salt.

In the formula (I), $L^1$ is an n-valent organic group, and n is 2, 3, 4, 5 or 6.

$L^1$ preferably is an n-valent organic group selected from the group consisting of an aliphatic group, an aromatic group, a heterocyclic group, —O—, —CO—, —SO—, $—SO_2—$, —NH—, —N<, —PO< and a combination thereof. $L^1$ more preferably is an n-valent organic group selected from the group consisting of a divalent or trivalent aliphatic group, a divalent or trivalent aromatic group, a divalent or trivalent heterocyclic group, —O—, —CO—, —NH—, —N< and a combination thereof.

The end of $L^1$ connecting to the benzocyclobutene ring preferably is —O—, —CO—, —NH— or a divalent aliphatic group, more preferably is —O— or —CO—, and most preferably is —O—.

$L^1$ preferably connects to carbon atom of the cyclobutene ring.

Examples of the compounds represented by the formula (I) are shown below.

(I-1)

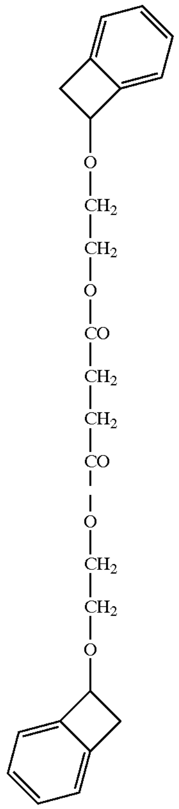

(I-2)

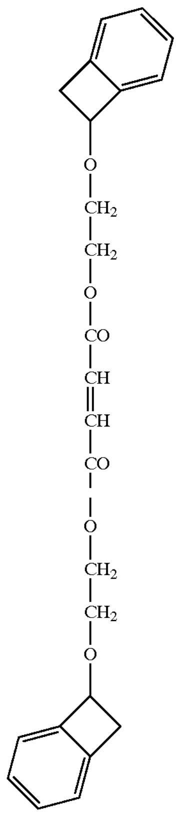

-continued
(I-3)
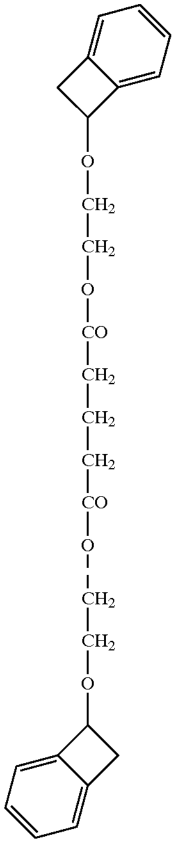
(I-4)
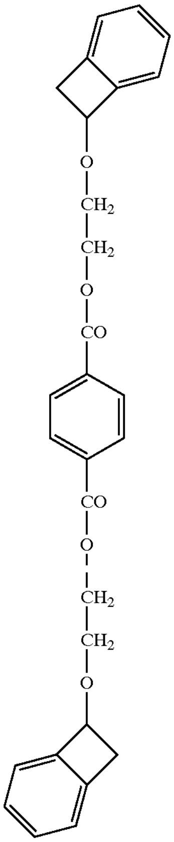
-continued
(I-5)
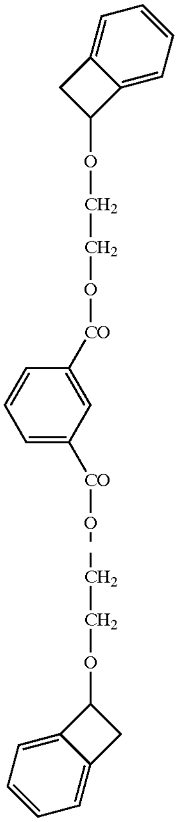
(I-6)
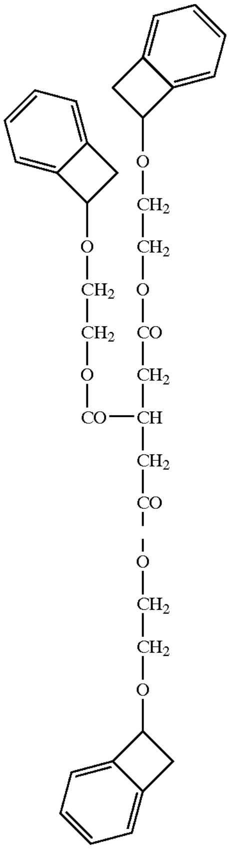

-continued
(I-7)
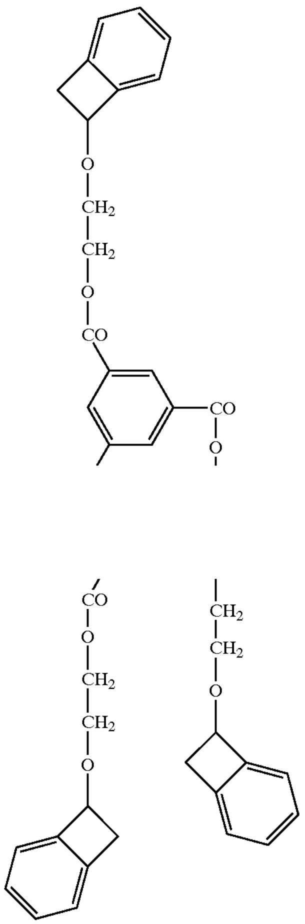
(I-8)
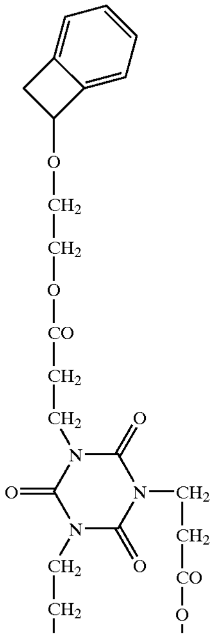
-continued
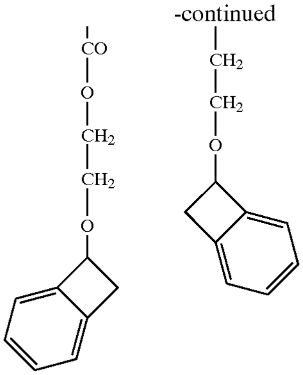
(I-9)
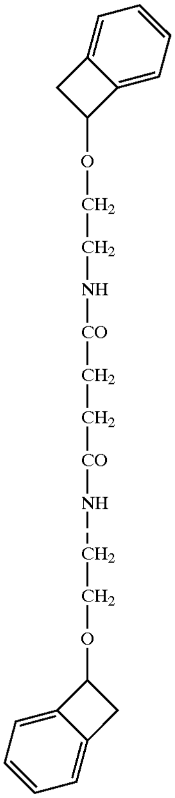
(I-10)
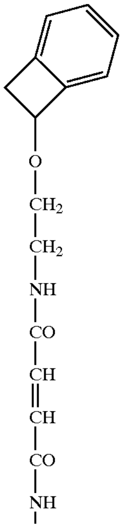

-continued
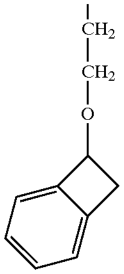
(I-11)
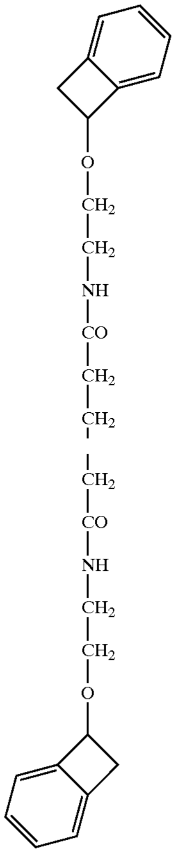
(I-12)
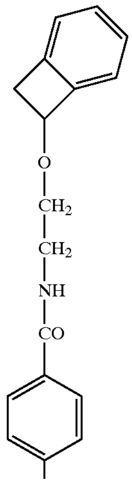
-continued
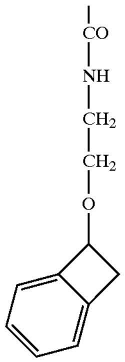
(I-13)
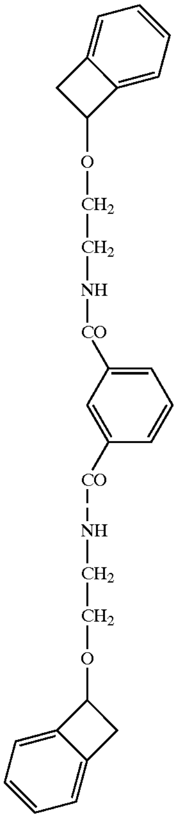
(I-14)
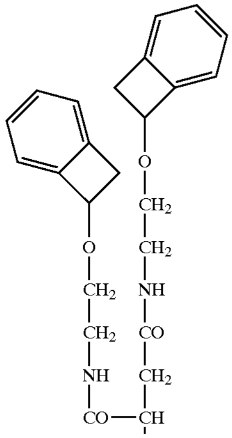

-continued
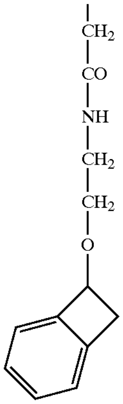
(I-15)
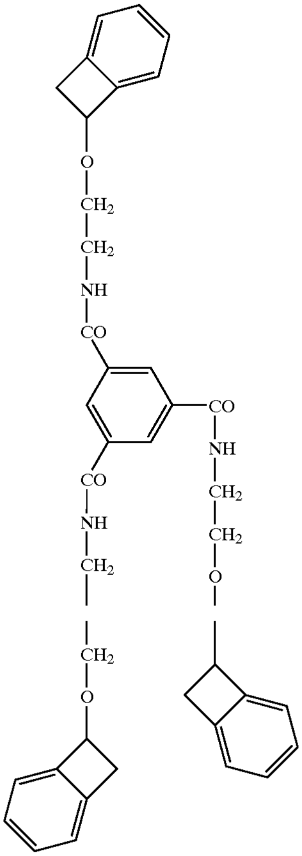
-continued
(I-16)
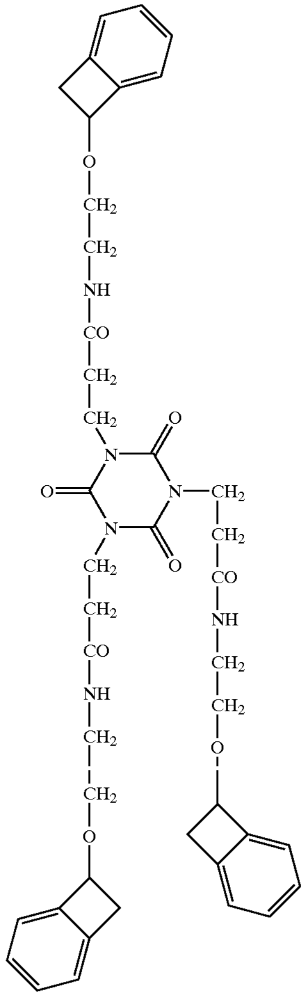
(I-17)
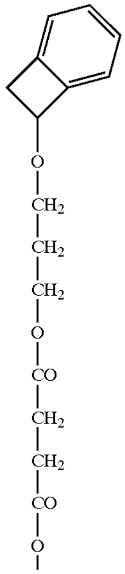

-continued
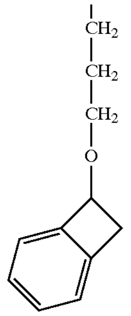
(I-18)
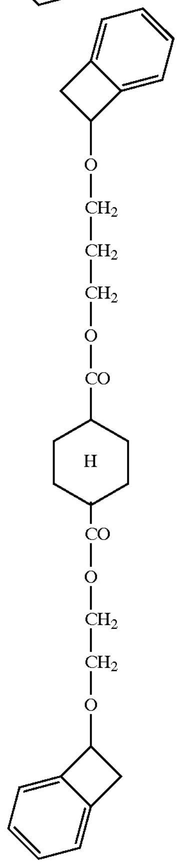
(I-19)
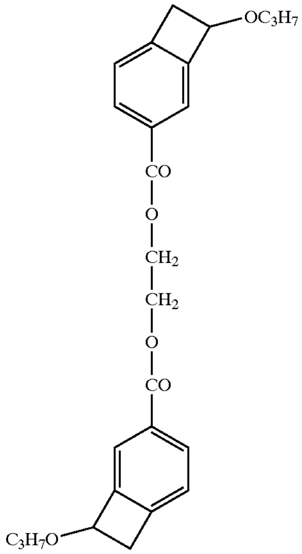
-continued
(I-20)
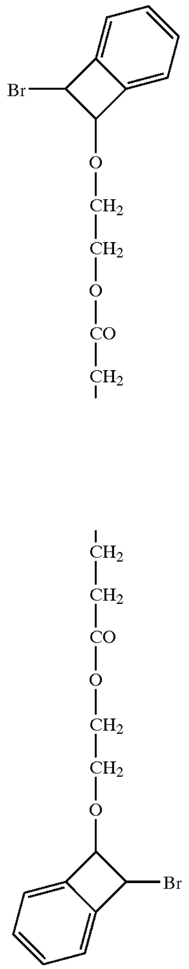
(I-21)
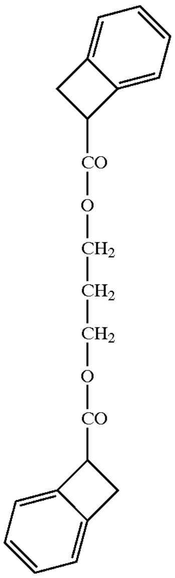

-continued
(I-22)
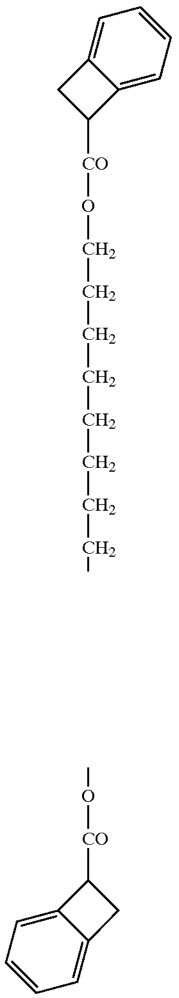
(I-23)
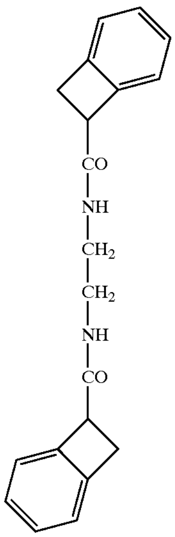
-continued
(I-24)
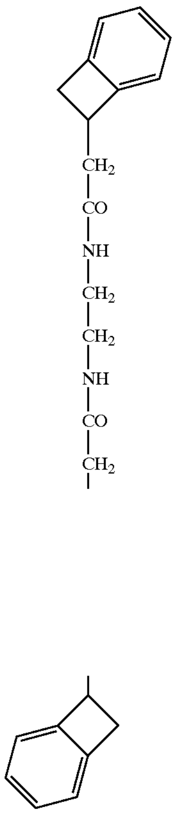
(I-25)
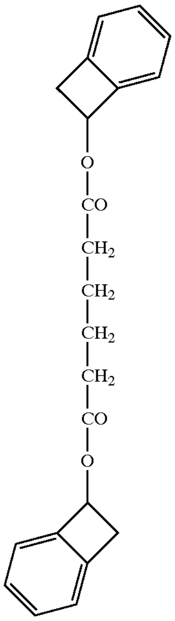

-continued
(I-26)
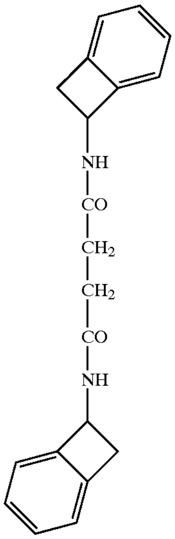
(I-27)
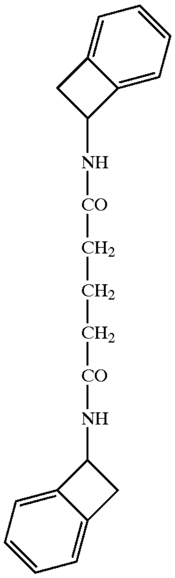
(I-28)
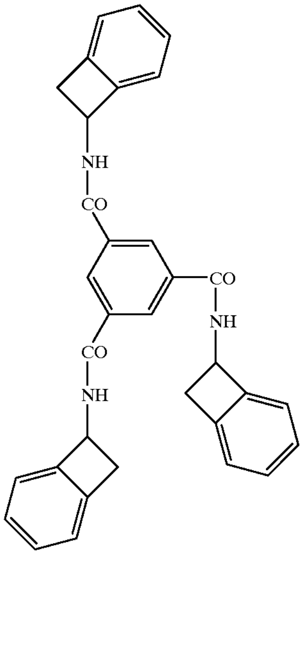
-continued
(I-29)
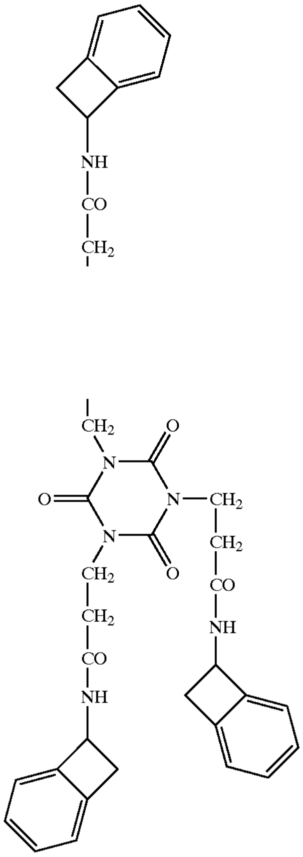
(I-30)
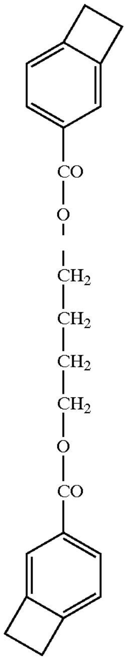

-continued (I-31)

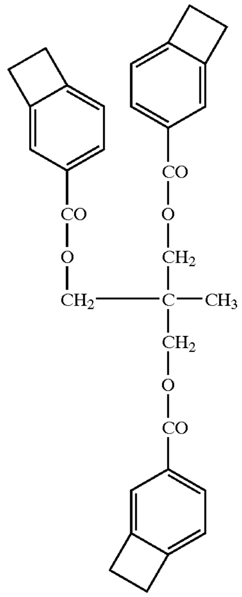

(I-32)

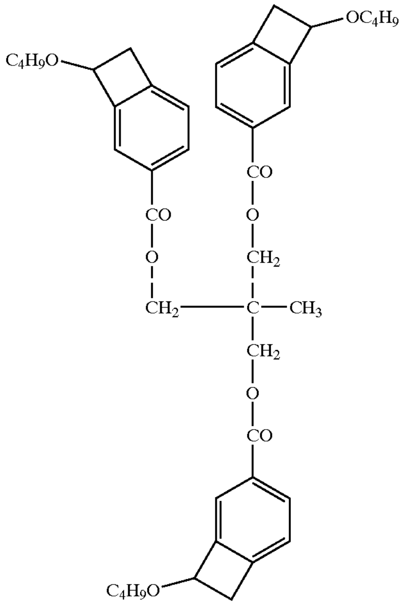

Synthesis Example 1

Synthesis of Compound (I-1)

To 56.1 g of potassium t-butoxide, 150 ml of ethylene glycol was dropwise added in a stream of nitrogen to dissolve potassium t-butoxide completely. To the solution, 45.3 g of 1-bromobenzocyclobutene (synthesized according to a method of DeCamp et al., J. Org. Chem., 1981, 46, 3918) was dropwise added. After the addition was completed, the mixture was heated to 80° C., and stirred for 8 hours. The mixture was cooled to room temperature, and poured into ice-cold water. After adjusting pH to 6 with hydrochloric acid, an organic phase was extracted with ethyl acetate. After the solvent was distilled away, the residue was purified in a silica gel chromatography to obtain 20.6 g of 1-(2'-hydroxyethoxy)-benzocyclobutene.

In 30 ml of tetrahydrofuran, 6.56 g of the obtained 1-(2'-hydroxyethoxy)-benzocyclobutene and 4.44 g of triethylamine were dissolved. The solution was cooled to 0° C. To the solution, 3.1 g of succinyl chloride was dropwise added. After the addition was completed, the mixture was heated to room temperature, and stirred for 4 hours. The mixture was poured into ice-cold water, and an organic phase was extracted with ethyl acetate. After the solvent was distilled away, the residue was purified in a silica gel chromatography to obtain 6.8 g of the compound (I-1).

Synthesis Example 2

Synthesis of Compound (I-2)

The procedures of the synthesis example 1 were repeated except that 3.1 g of fumaryl chloride was used in place of 3.1 g of succinyl chloride to obtain 5.6 g of the compound (I-2).

Synthesis Example 3

Synthesis of Compound (I-3)

The procedures of the synthesis example 1 were repeated except that 3.66 g of adipyl chloride was used in place of 3.1 g of succinyl chloride to obtain 5.5 g of the compound (I-3).

Synthesis Example 4

Synthesis of Compound (I-7)

The procedures of the synthesis example 1 were repeated except that the amount of 1-(2'-hydroxyethoxy)-benzocyclobutene was changed from 6.56 g to 5.41 g, 2.65 g of trimesyl chloride was used in place of 3.1 g of succinyl chloride, and the amount of triethylamine was changed from 4.44 g to 3.33 g to obtain 5.8 g of the compound (I-7).

The other compounds can also be synthesized according to a method similar to the synthesis examples.

The compound having two or more o-quinodimethane structures or precursor structures thereof is contained in an image forming layer preferably in an amount of 5 to 90 wt. %, and more preferably in an amount of 30 to 80 wt. %.

The compound having two or more o-quinodimethane structures or precursor structures thereof can be in the form of a hydrophobic polymer.

The main chain of the hydrophobic polymer preferably is hydrocarbon (polyolefin), polyester, polyamide, polyimide, polyurea, polyurethane, polyether or a combination thereof. A hydrocarbon main chain is particularly preferred.

The main chain of the hydrophobic polymer can have a substituent group in addition to side chains containing an o-quinodimethane structure or a precursor structure thereof. Examples of the substituent groups include a halogen atom (F, Cl, Br, I), amino, ammonio, hydroxyl, mercapto, carboxyl, sulfo, a sulfuric ester group, phosphono, a phosphoric ester group, cyano, carbamoyl, a monovalent aliphatic group, a monovalent aromatic group, a monovalent heterocyclic group, —O—R, —S—R, —CO—R, —NH—R, —N(—R)$_2$, —N$^+$H$_2$—R, —N$^+$H(—R)$_2$, —N$^+$(—R)$_3$, —CO—O—R, —O—CO—R, —CO—NH—R, —CO—N(—R)$_2$, —NH—CO—R, —N(—R)—CO—R, —P(=O)(—OH)—O—R and —P(=O)(—O—R)$_2$. Each of the groups represented by R independently is a monovalent aliphatic group, a monovalent aromatic group or a monovalent heterocyclic group. Carboxyl, sulfo, the sulfuric ester group, phosphono and the phosphoric ester group can be dissociated or can be in the form of a salt.

Two or more substituent groups of the main chain can be combined with each other to form an aliphatic or heterocyclic ring, which may form a spiro linkage with the main chain. The formed ring can have a substituent group. Examples of the substituent groups include a halogen atom (F, Cl, Br, I), amino, ammonio, hydroxyl, mercapto, carboxyl, sulfo, a sulfuric ester group, phosphono, a phosphoric ester group, cyano, carbamoyl, oxo (=O), thio (=S), a monovalent aliphatic group, a monovalent aromatic group, a monovalent heterocyclic group, —O—R, —S—R, —CO—R, —NH—R, —N(—R)$_2$, —N$^+$H$_2$—R, —N$^+$H(—R)$_2$, —N$^+$(—R)$_3$, —CO—O—R, —O—CO—R, —CO—NH—R, —CO—N(—R)$_2$, —NH—CO—R, —N(—R)—CO—R, —P(=O)(—OH)—O—R and —P(=O)(—O—R)$_2$. Each of the groups represented by R independently is a monovalent aliphatic group, a monovalent aromatic group or a monovalent heterocyclic group. Carboxyl, sulfo, the sulfuric ester group, phosphono and the phosphoric ester group can be dissociated, or can be in the form of a salt.

The hydrophobic polymer preferably comprises a repeating unit having a side chain containing benzocyclobutene structure, which is represented by the formula (II).

(II)

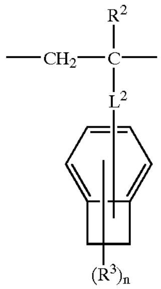

In the formula (II), $R^2$ is hydrogen, a halogen atom (F, Cl, Br, I) or an alkyl group having 1 to 10 carbon atoms. $R^2$ preferably is hydrogen or an alkyl group having 1 to 6 carbon atoms, more preferably is hydrogen or an alkyl group having 1 to 3 carbon atoms, and most preferably is hydrogen or methyl.

In the formula (II), $L^2$ is a single bond or a divalent linking group. The divalent linking group preferably is —CO—, —O—, —S—, —NH—, —SO$_2$—, an alkylene group, an arylene group or a combination thereof.

The alkylene group preferably has 1 to 12 carbon atoms, more preferably has 1 to 8 carbon atoms, and most preferably has 1 to 6 carbon atoms. The alkylene group can have a cyclic or branched structure. The alkylene group can have a substituent group. Examples of the substituent groups are the same as the substituent groups of the aliphatic groups.

The arylene group preferably is phenylene or naphthylene, more preferably is phenylene, and most preferably is p-phenylene. The arylene group can have a substituent group. Examples of the substituent groups are the same as the substituent groups of the aromatic groups.

Examples of $L^2$ are shown below. In each of the following examples, the left side is attached to the main chain, and the right side is attached to the benzocyclobutene ring. In the examples, AL represents an alkylene group.

| | |
|---|---|
| L0: | single bond |
| L1: | —O— |
| L2: | —CO—O— |
| L3: | —CO—O—AL—O— |
| L4: | —CO—NH— |
| L5: | —CO—NH—AL—O— |
| L6: | —CO—NH—AL—NH— |

In the formula (II), $R^3$ is a substituent group of the benzocyclobutene ring, and n is 0, 1, 2, 3, 4 or 5.

Examples of the substituent groups include a halogen atom (F, Cl, Br, I), amino, ammonio, hydroxyl, mercapto, carboxyl, sulfo, a sulfuric ester group, phosphono, a phosphoric ester group, cyano, carbamoyl, a monovalent aliphatic group, a monovalent aromatic group, a monovalent heterocyclic group, —O—R, —S—R, —CO—R, —NH—R, —N(—R)$_2$, —N$^+$H$_2$—R, —N$^+$H(—R)$_2$, —N$^+$(—R)$_3$, —CO—O—R, —O—CO—R, —CO—NH—R, —CO—N(—R)$_2$, —NH—CO—R, —N(—R)—CO—R, —P(=O)(—OH)—O—R and —P(=O)(—O—R)$_2$. Each of the groups represented by R independently is a monovalent aliphatic group, a monovalent aromatic group or a monovalent heterocyclic group. Carboxyl, sulfo, the sulfuric ester group, phosphono and the phosphoric ester group can be dissociated, or can be in the form of a salt.

The substituent group of the benzocyclobutene ring preferably is a halogen atom, amino, a monovalent aliphatic group, a monovalent aromatic group, —O—R, —S—R, —CO—R, —NH—R, —N(—R)$_2$ or —NH—CO—R.

Examples of the repeating units represented by the formula (II) are shown below.

(II-1)

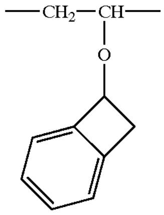

(II-2)

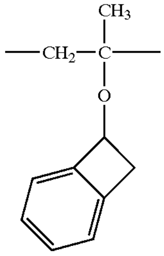

(II-3)

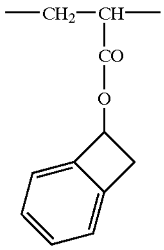

(II-4)

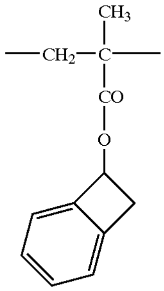

-continued
(II-5)
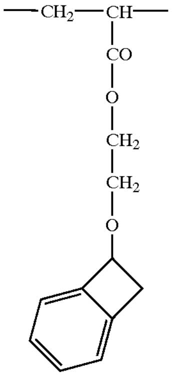
(II-6)
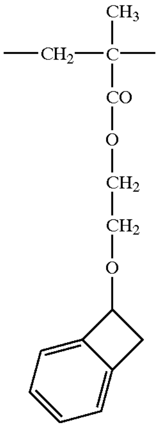
(II-7)
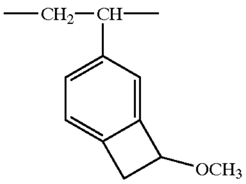
(II-8)
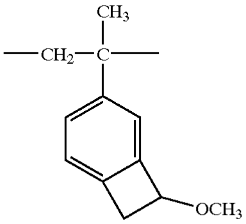
(II-9)
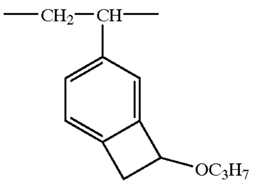
-continued
(II-10)
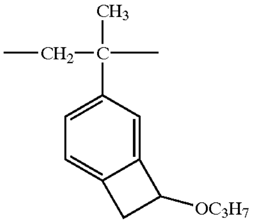
(II-11)
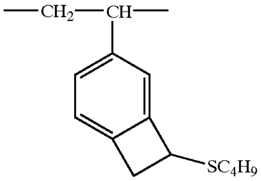
(II-12)
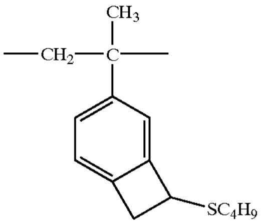
(II-13)
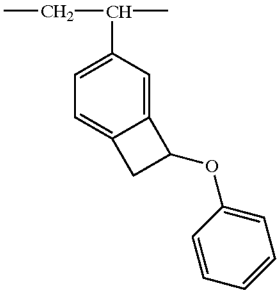
(II-14)
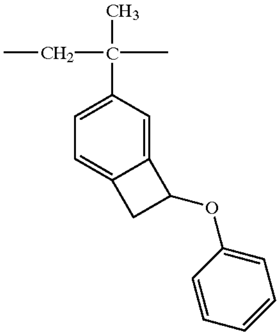
(II-15)
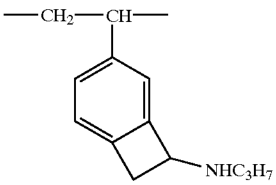

-continued (II-16)

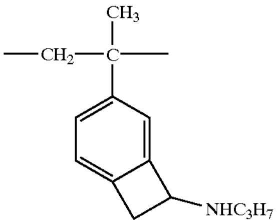

(II-17)

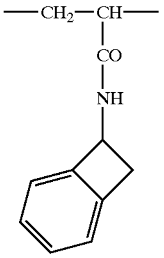

(II-18)

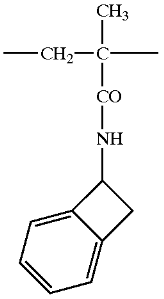

(II-19)

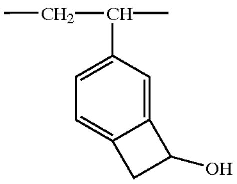

(II-20)

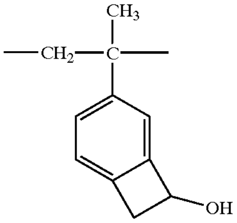

(II-21)

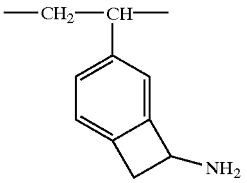

(II-22)

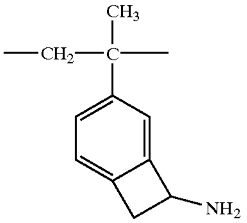

-continued (II-23)

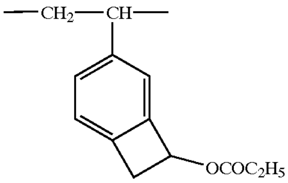

(II-24)

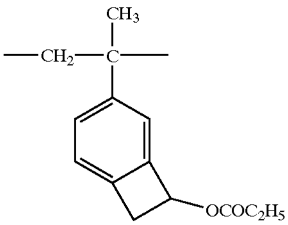

(II-25)

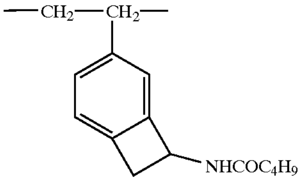

(II-26)

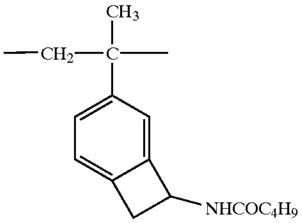

(II-27)

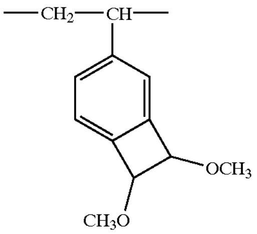

(II-28)

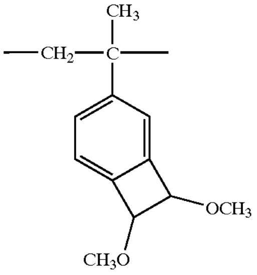

The hydrophobic polymer can be a homopolymer consisting of a repeating unit represented by the formula (II). The hydrophobic polymer can also be a copolymer comprising two or more repeating units represented by the formula (II). Further, the hydrophobic polymer can be a copolymer comprising a repeating unit represented by the formula (II) and another repeating unit. Examples of the other repeating units are shown below.

(III-1)
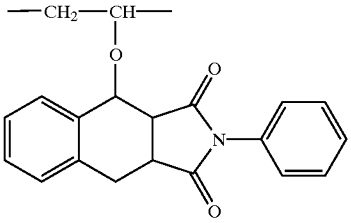
(III-2)
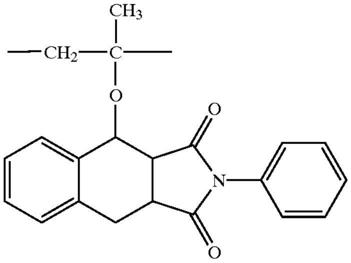
(III-3)
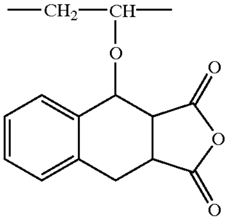
(III-4)
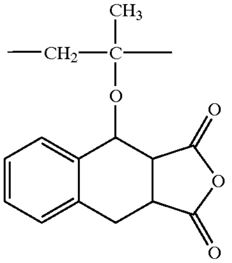
(III-5)
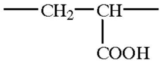
(III-6)
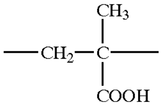
(III-7)
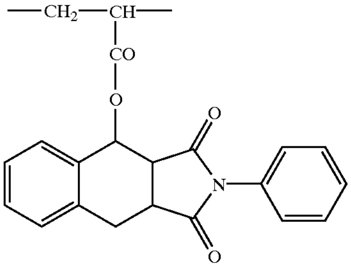
(III-8)
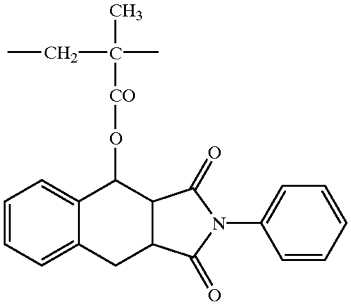
-continued
(III-9)
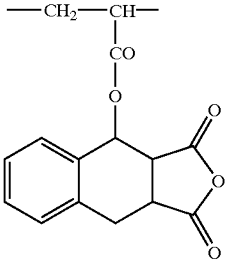
(III-10)
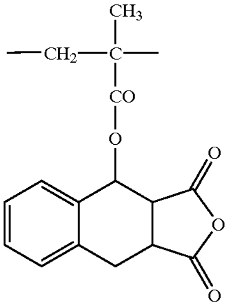
(III-11)
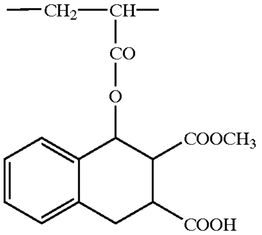
(III-12)
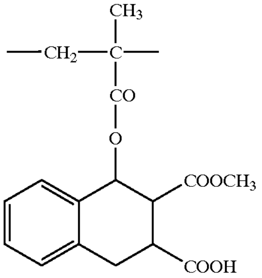
(III-13)
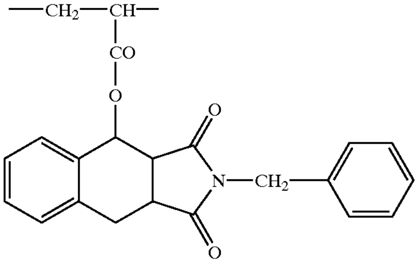
(III-14)
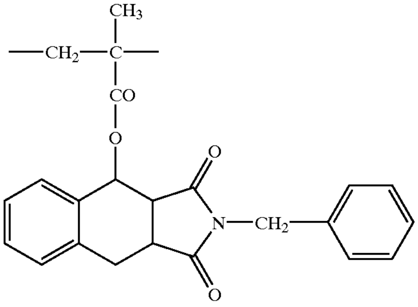

-continued
(III-15)
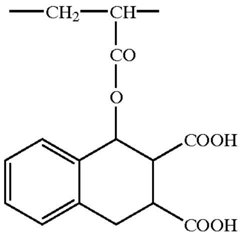
(III-16)
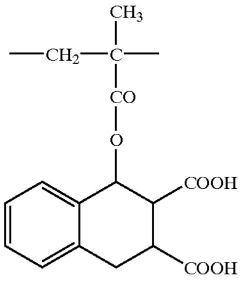
(III-17)
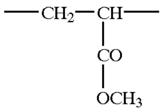
(III-18)
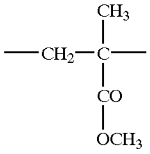
(III-19)
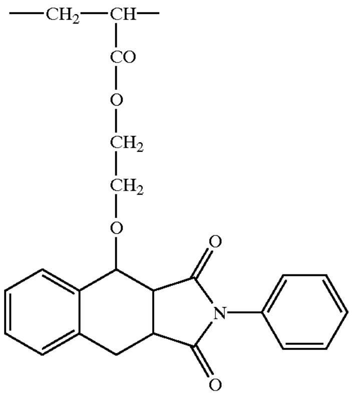
(III-20)
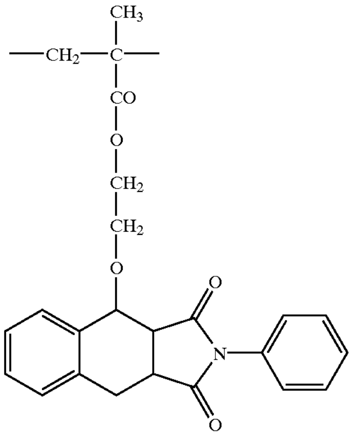
-continued
(III-21)
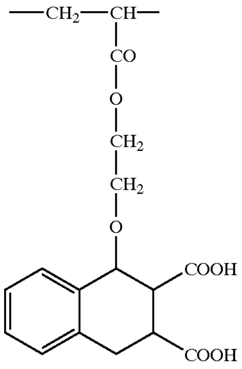
(III-22)
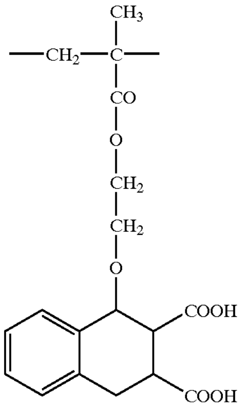
(III-23)
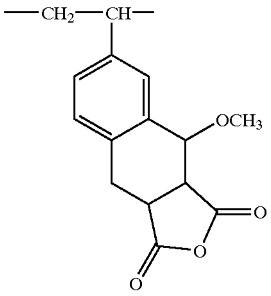
(III-24)
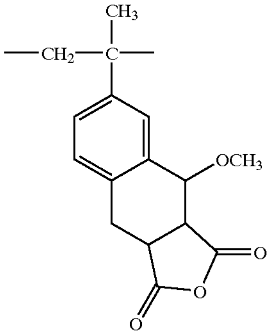

-continued (III-25)

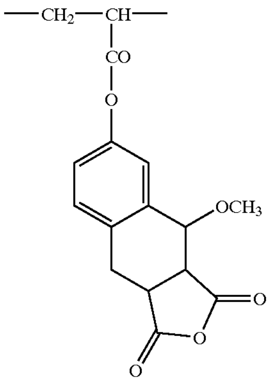

(III-26)

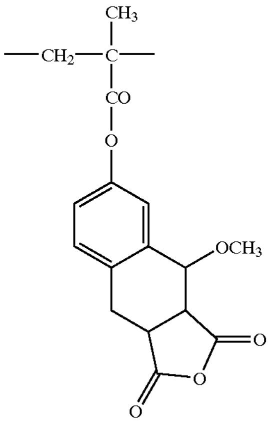

In the case where the unheated area of the image-forming layer is removed with an alkaline developing solution, the hydrophobic polymer preferably has an acidic group. The hydrophobic polymer more preferably comprises a repeating unit having an acidic group in addition to a repeating unit having an o-quinodimethane structure or a precursor structure thereof. The acidic group preferably is carboxyl (shown in III-5, III-6, III-11, III-12, III-15, III-16, III-21 or III-22) or carboxylic anhydride (shown in III-3, III-4, III-9, III-10, III-23, III-24, III-25 or III-26).

In the case where the copolymer consists of the repeating unit having an o-quinodimethane structure or a precursor structure thereof and another repeating unit (which does not has the o-quinodimethane structure or the precursor structure thereof), the molar ratio of the former repeating unit to the latter repeating unit is preferably in the range of 5/95 to 99/1, more preferably in the range of 10/90 to 98/2, further preferably in the range of 20/80 to 97/3, furthermore preferably in the range of 40/60 to 96/4, and most preferably in the range of 60/40 to 95/5.

Examples of the copolymer are shown below. In each of the following examples, the number in the parentheses represents the corresponding repeating unit shown above. The ratio of the repeating unit is in terms of mol. %.

| | | | |
|---|---|---|---|
| CP1: | $-(II\text{-}1)_{70}-$ | $-(III\text{-}1)_{30}-$ | |
| CP2: | $-(II\text{-}1)_{80}-$ | $-(III\text{-}3)_{20}-$ | |
| CP3: | $-(II\text{-}1)_{80}-$ | $-(III\text{-}5)_{20}-$ | |
| CP4: | $-(II\text{-}3)_{80}-$ | $-(III\text{-}7)_{20}-$ | |
| CP5: | $-(II\text{-}3)_{80}-$ | $-(III\text{-}9)_{20}-$ | |
| CP6: | $-(II\text{-}3)_{60}-$ | $-(III\text{-}11)_{40}-$ | |
| CP7: | $-(II\text{-}3)_{70}-$ | $-(III\text{-}5)_{30}-$ | |
| CP8: | $-(II\text{-}4)_{70}-$ | $-(III\text{-}14)_{30}-$ | |
| CP9: | $-(II\text{-}4)_{70}-$ | $-(III\text{-}16)_{30}-$ | |
| CP10: | $-(II\text{-}4)_{80}-$ | $-(III\text{-}5)_{20}-$ | |
| CP11: | $-(II\text{-}5)_{60}-$ | $-(III\text{-}17)_{40}-$ | |
| CP12: | $-(II\text{-}5)_{75}-$ | $-(III\text{-}19)_{25}-$ | |
| CP13: | $-(II\text{-}5)_{70}-$ | $-(III\text{-}21)_{30}-$ | |
| CP14: | $-(II\text{-}5)_{60}-$ | $-(III\text{-}17)_{10}-$ | $-(III\text{-}5)_{30}-$ |
| CP15: | $-(II\text{-}5)_{60}-$ | $-(III\text{-}5)_{40}-$ | |
| CP16: | $-(II\text{-}6)_{70}-$ | $-(III\text{-}18)_{30}-$ | |
| CP17: | $-(II\text{-}6)_{70}-$ | $-(III\text{-}20)_{30}-$ | |
| CP18: | $-(II\text{-}6)_{80}-$ | $-(III\text{-}22)_{20}-$ | |
| CP19: | $-(II\text{-}6)_{60}-$ | $-(III\text{-}18)_{20}-$ | $-(III\text{-}6)_{20}-$ |
| CP20: | $-(II\text{-}6)_{65}-$ | $-(III\text{-}6)_{35}-$ | |
| CP21: | $-(II\text{-}7)_{80}-$ | $-(III\text{-}23)_{20}-$ | |
| CP22: | $-(II\text{-}9)_{75}-$ | $-(III\text{-}23)_{25}-$ | |
| CP23: | $-(II\text{-}7)_{90}-$ | $-(III\text{-}25)_{10}-$ | |
| CP24: | $-(II\text{-}7)_{75}-$ | $-(III\text{-}5)_{25}-$ | |
| CP25: | $-(II\text{-}18)_{80}-$ | $-(III\text{-}5)_{20}-$ | |

The polymer can have a main chain containing an o-quinodimethane structure or a precursor structure thereof. Examples of the repeating units having the o-quinodimethane structure or a precursor structure thereof in the main chain are shown below.

(IV-1)

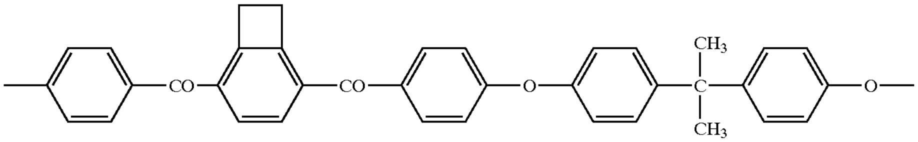

(IV-2)

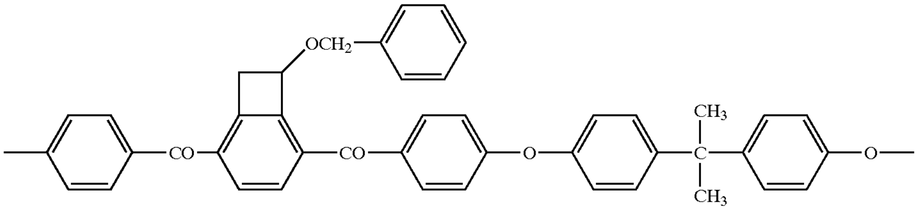

-continued (IV-3)

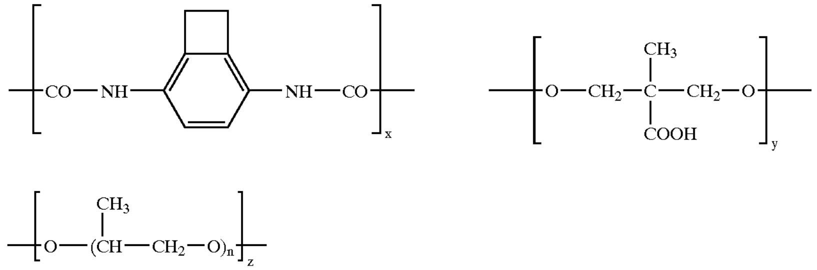

x:y:z = 100:50:50, n = 50-500

The polymer can be synthesized through a polymerization reaction of monomers (generally, ethylenically unsaturated monomers), which correspond to the above-described repeating units. Examples of the polymerization reaction include a radical polymerization reaction, a cationic polymerization reaction and an anionic polymerization reaction. The o-quinodimethane structures or a precursor structures thereof can be introduced into the polymer after the main chain of polymer is synthesized.

A polymerization initiator (chain transfer agent) is preferably used in the polymerization reaction. The amount of the polymerization initiator is preferably in the range of 0.05 to 10 wt. % based on the total amount of the monomers.

The polymer has a weight average molecular weight preferably in the range of 500 to 1,000,000, more preferably in the range of 1,000 to 500,000, further preferably in the range of 2,000 to 200,000, and most preferably in the range of 5,000 to 100,000.

The polymer is contained in the image-forming layer preferably in the amount of 5 to 90 wt. %, and more preferably in the amount of 30 to 80 wt. %.

[Hydrophobic Polymer]

The image-forming layer can contain a hydrophobic polymer other than a polymer having o-quinodimethane structures or precursor structures thereof (described above) or a polymer having dienophile structures (described below).

The hydrophobic polymer can function as a binder of the image-forming layer or particles contained in the layer.

The main chain of the hydrophobic polymer preferably is hydrocarbon (polyolefin), polyester, polyamide, polyimide, polyurea, polyurethane, polyether or a combination thereof. A hydrocarbon main chain is particularly preferred.

The main chain of the hydrophobic polymer can have a substituent group. Examples of the substituent groups include a halogen atom (F, Cl, Br, I), amino, ammonio, hydroxyl, mercapto, carboxyl, sulfo, a sulfuric ester group, phosphono, a phosphoric ester group, cyano, carbamoyl, a monovalent aliphatic group, a monovalent aromatic group, a monovalent heterocyclic group, —O—R, —S—R, —CO—R, —NH—R, —N(—R)$_2$, —N$^+$H$_2$—R, —N$^+$H(—R)$_2$, —N$^+$(—R)$_3$, —CO—O—R, —O—CO—R, —CO—NH—R, —CO—N(—R)$_2$, —NH—CO—R, —N(—R)—CO—R, —P(=O)(—OH)—O—R and —P(=O)(—O—R)$_2$. Each of the groups represented by R independently is a monovalent aliphatic group, a monovalent aromatic group or a monovalent heterocyclic group. Carboxyl, sulfo, the sulfuric ester group, phosphono and the phosphoric ester group can be dissociated or can be in the form of a salt.

Two or more substituent groups of the main chain can be combined with each other to form an aliphatic or heterocyclic ring, which may form a spiro linkage with the main chain. The formed ring can have a substituent group. Examples of the substituent groups include a halogen atom (F, Cl, Br, I), amino, ammonio, hydroxyl, mercapto, carboxyl, sulfo, a sulfuric ester group, phosphono, a phosphoric ester group, cyano, carbamoyl, oxo (=O), thio (=S), a monovalent aliphatic group, a monovalent aromatic group, a monovalent heterocyclic group, —O—R, —S—R, —CO—R, —NH—R, —N(—R)$_2$, —N$^+$H$_2$—R, —N$^+$H(—R)$_2$, —N$^+$(—R)$_3$, —CO—O—R, —O—CO—R, —CO—NH—R, —CO—N(—R)$_2$, —NH—CO—R, —N(—R)—CO—R, —P(=O)(—OH)—O—R and —P(=O)(—O—R)$_2$. Each of the groups represented by R independently is a monovalent aliphatic group, a monovalent aromatic group or a monovalent heterocyclic group. Carboxyl, sulfo, the sulfuric ester group, phosphono and the phosphoric ester group can be dissociated, or can be in the form of a salt.

In the case where the unheated area of the image-forming layer is removed with an alkaline developing solution, the hydrophobic polymer preferably has an acidic group. The hydrophobic polymer more preferably comprises a repeating unit having an acidic group in addition to a hydrophobic repeating unit. The acidic group preferably is carboxyl or carboxylic anhydride.

The polymer has a weight average molecular weight preferably in the range of 500 to 1,000,000, more preferably in the range of 1,000 to 500,000, further preferably in the range of 2,000 to 200,000, and most preferably in the range of 5,000 to 100,000.

The polymer is contained in the image-forming layer preferably in the amount of 5 to 90 wt. %, and more preferably in the amount of 30 to 80 wt. %.

[Particles]

The hydrophobic polymer can be in the form of particles contained in an image-forming layer.

In preparation of the particles, an emulsion polymerization is preferred to synthesize the polymer. The polymer particles can be formed simultaneously with the emulsion polymerization reaction. The emulsion polymerization can be conducted under condition as the same as the conditions for forming latex.

A surface active agent (a cationic surface active agent, an anionic surface active agent, a nonionic surface active agent, an amphoteric surface active agent) is preferably used in the emulsion polymerization to form uniform fine particles. The amount of the surface active agent is preferably in the range of 0.01 to 10 wt. % based on the total amount of the monomers.

The particles have sizes preferably in the range of 5 to 500 nm, and more preferably in the range of 10 to 300 nm. The size distribution of the particles is preferably uniform.

The particles can contain two or more polymers. The image-forming layer can contain two or more kinds of the particles.

The particles of the polymer can be prepared by dissolving the polymer in an organic solvent (which is preferably not miscible with water), mixing the solution with water (which preferably contains a dispersing agent) to prepare an emulsion, and heating the emulsion to remove the organic solvent. The droplets contained in the emulsion are solidified to form fine particles.

Microcapsules containing the polymer can also be used as the fine particles of the polymer.

The microcapsules can be prepared according to known methods such as coacervation method (described in U.S. Pat. Nos. 2,800,457 and 2,800,458), interfacial polymerization method (described in British Patent No. 990,443, U.S. Pat. No. 3,287,154, Japanese Patent Publication Nos. 38(1963)-19574, 42(1967)-446 and 42(1967)-711), polymer deposition method (described in U.S. Pat. Nos. 3,418,250, 3,660,304), isocyanate/polyol wall formation method (described in U.S. Pat. No. 3,796,669), isocyanate wall formation method (described in U.S. Pat. No. 3,914,511), urea/formaldehyde or urea/formaldehyde-resorcinol wall formation method (described in U.S. Pat. Nos. 4,001,140, 4,087,376, 4,089,802), melamine-formaldehyde or hydroxyalkyl cellulose wall formation method (described in U.S. Pat. No. 4,025,445), in situ method with monomer polymerization (described in Japanese Patent Publication Nos. 36(1961)-9163, 51(1976)-9079), spry-drying method (described in British Patent No. 930,422, U.S. Pat. No. 3,111,407) and electrolytic dispersion cooling method (described in British Patent Nos. 952,807 and 967,074).

The wall of microcapsules preferably has a three-dimensional cross-linking structure, which can be swelled with a solvent. The wall of microcapsules is preferably made of polyurea, polyurethane, polyester, polycarbonate, polyamide or a mixture thereof. Polyurea or polyurethane is particularly preferred. The above-described hydrophobic polymer may be used for the microcapsule wall.

The microcapsules have a mean particle size preferably in the range of 0.01 to 20 μm, more preferably in the range of 0.05 to 2.0 μm, and most preferably in the range of 0.10 to 1.0 μm.

Two or more microcapsules can be fused with each other by heat. The contents of microcapsules ooze out the microcapsule, ooze onto the microcapsule surface, or penetrate into the microcapsules wall when the microcapsules are coated on a support. The oozing or penetrating contents are reacted by heat to fuse the microcapsules.

Two or more kinds of microcapsules can be used in combination.

The amount of the microcapsules contained in the image-forming layer is preferably in the range of 10 to 60 wt. %, and more preferably in the range of 15 to 40 wt. % in terms of solid content. A press development can be conducted with excellent sensitivity and plate wear when the amount is adjusted within the above-mentioned range.

A solvent dissolving the contents (such as a compound having a thermo reactive group) and swelling the microcapsule wall can be added into dispersion of the microcapsules.

Alcohols, ethers, acetals, esters, ketones, polyhydric alcohols, amides, amines and fatty acids can be used as the solvents. Examples of the solvents include methanol, ethanol, propanol, t-butanol, tetrahydrofuran, methyl lactate, ethyl lactate, methyl ethyl ketone, propylene glycol monomethyl ether, ethylene glycol diethyl ether, ethylene glycol monomethyl ether, γ-butyl lactone, N,N-dimethylformamide and N,N-dimethylacetamide. Two or more solvents can be used in combination.

The solvent is contained in a coating solution of an image-forming layer preferably in an amount of 5 to 95 wt. %, more preferably in an amount of 10 to 90 wt. %, and most preferably in an amount of 15 to 85 wt. %.

[Compound Having Dienophile Structures]

A compound or a polymer having o-quinodimethane structures or precursor structures thereof itself can be polymerized or cross-linked. However, it is preferred that the compound or the polymer is polymerized or cross-linked with a compound or polymer having dienophile structures to form a strong polymer of cross-linked structure. A lithographic plate improved in print wear can be obtained by the strong polymer or cross-linked structure.

The term "dienophile structure" means the unsaturated linkage generally defined in Diels-Alder reaction. Namely, the dienophile structure is the unsaturated linkage that causes the Diels-Alder reaction with diene. Accordingly, the dienophile structure includes not only carbon-carbon double bond (>C═C<) and carbon-carbon triple bond (—C≡C—), but also unsaturated bonds containing hetero atoms such as carbonyl bond (>C═O), nitroso bond (—N═O) and azo bond (—N═N—). Carbon-carbon double bond (>C═C<) is particularly preferred.

The compound having two or more dienophile structures preferably is an ester of an unsaturated carboxylic acid (e.g., acrylic acid, methacrylic acid) with a polyhydric alcohol (e.g., glycol, glycerol, pentaerythritol) or an imide obtained by condensation of polyamine (e.g., methylenediamine, phenylenediamine, di(aminophenyl)methane) with an unsaturated dicarboxylic acid (.e., maleic acid) or anhydride thereof (e.g., maleic anhydride).

The compound having two or more dienophile structures is preferably represented by the formula (V).

$$(\text{Di-})_n L^3 \qquad \text{(V)}$$

In the formula (V), Di is a dienophile structure.

In the formula (V), $L^3$ is n-valent organic residue, and n is 2, 3, 4, 5 or 6.

$L^3$ preferably is an n-valent organic group selected from the group consisting of an aliphatic group, an aromatic group, a heterocyclic group, —O—, —CO—, —SO—, —$SO_2$—, —NH—, —N<, —PO< and a combination thereof. $L^3$ more preferably is an n-valent organic group selected from the group consisting of a divalent, trivalent or tetravalent aliphatic group, a divalent, trivalent or tetravalent aromatic group, a divalent, trivalent or tetravalent heterocyclic group, —O—, —CO—, —NH—, —N< and a combination thereof.

The end of $L^3$ connecting to the dienophile structure (Di) preferably is —O—, —CO—, —NH— or a divalent, trivalent or tetravalent aliphatic group.

Examples of the compound represented by the formula (V) are shown below.

(V-1)

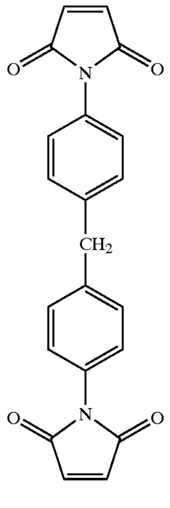

-continued
(V-2)
(V-3)
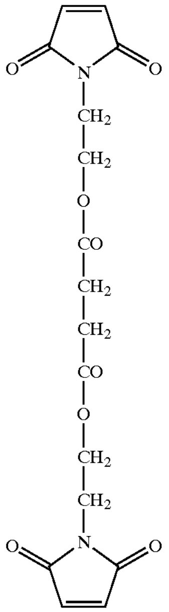
-continued
(V-4)
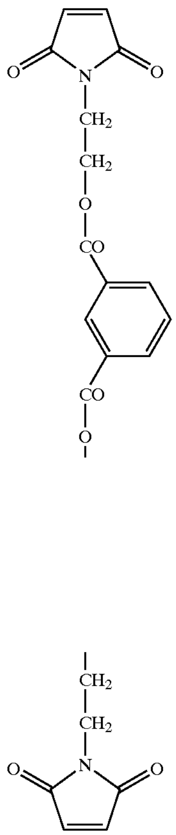
(V-5)
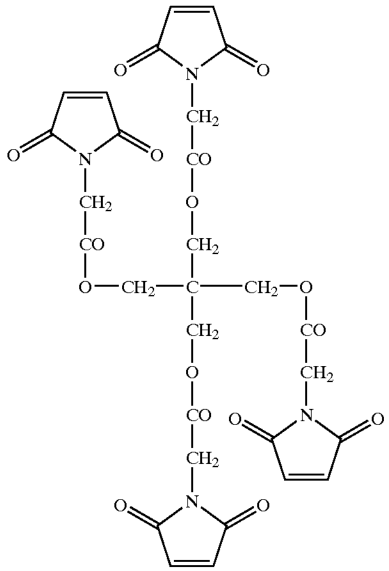

-continued
(V-6)
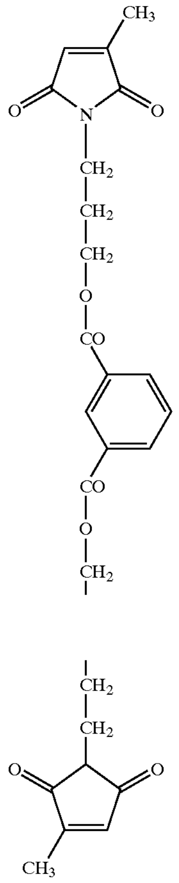
(V-7)
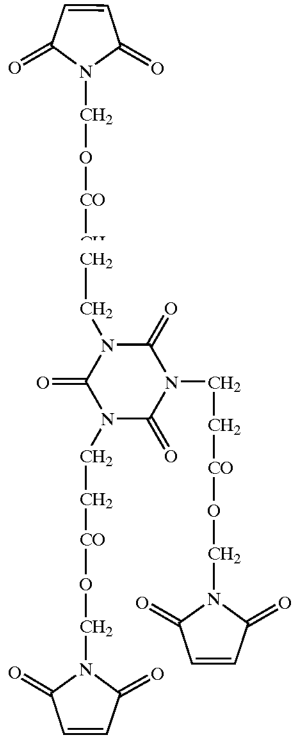
-continued
(V-8)
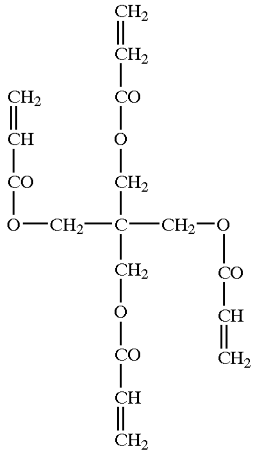
(V-9)
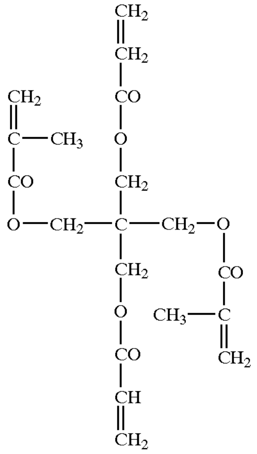
(V-10)
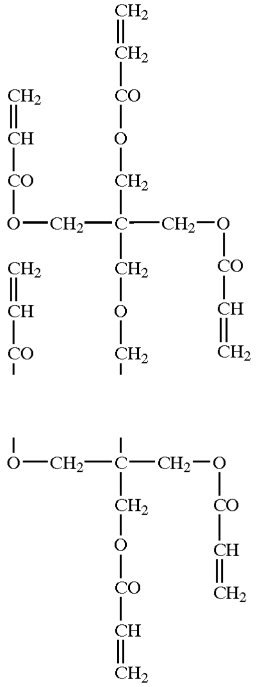

-continued (V-11)

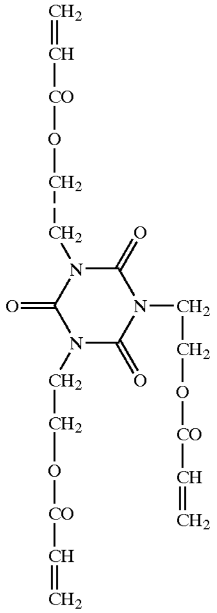

(V-12)

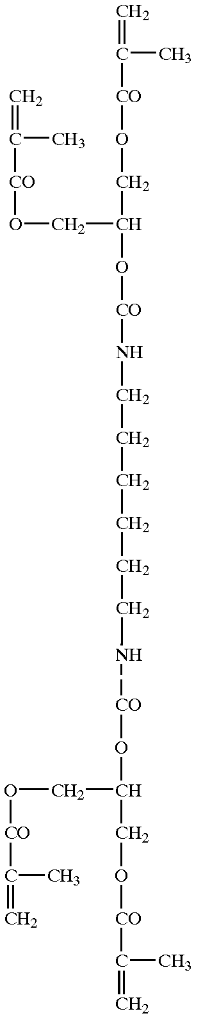

The compound having dienophile structures can be in the form of a polymer. The polymer can function as a hydrophobic polymer. The dienophile structures are preferably contained in the side chains of the polymer.

The main chain of the polymer preferably is hydrocarbon (polyolefin), polyester, polyamide, polyimide, polyurea, polyurethane, polyether or a combination thereof. A hydrocarbon main chain is particularly preferred.

The main chain of the hydrophobic polymer can have a substituent group in addition to side chains containing dienophile structures. Examples of the substituent groups include a halogen atom (F, Cl, Br, I), amino, ammonio, hydroxyl, mercapto, carboxyl, sulfo, a sulfuric ester group, phosphono, a phosphoric ester group, cyano, carbamoyl, a monovalent aliphatic group, a monovalent aromatic group, a monovalent heterocyclic group, —O—R, —S—R, —CO—R, —NH—R, —N(—R)$_2$, —N$^+$H$_2$—R, —N$^+$H(—R)$_2$, —N$^+$(—R)$_3$, —CO—O—R, —O—CO—R, —CO—NH—R, —CO—N(—R)$_2$, —NH—CO—R, —N(—R)—CO—R, —P(=O)(—OH)—O—R and —P(=O)(—O—R)$_2$. Each of the groups represented by R independently is a monovalent aliphatic group, a monovalent aromatic group or a monovalent heterocyclic group. Carboxyl, sulfo, the sulfuric ester group, phosphono and the phosphoric ester group can be dissociated or can be in the form of a salt.

Two or more substituent groups of the main chain can be combined with each other to form an aliphatic or heterocyclic ring, which may form a spiro linkage with the main chain. The formed ring can have a substituent group. Examples of the substituent groups include a halogen atom (F, Cl, Br, I), amino, ammonio, hydroxyl, mercapto, carboxyl, sulfo, a sulfuric ester group, phosphono, a phosphoric ester group, cyano, carbamoyl, oxo (=O), thio (=S), a monovalent aliphatic group, a monovalent aromatic group, a monovalent heterocyclic group, —O—R, —S—R, —CO—R, —NH—R, —N(—R)$_2$, —N$^+$H$_2$—R, —N$^+$H(—R)$_2$, —N$^+$(—R)$_3$, —CO—O—R, —O—CO—R, —CO—NH—R, —CO—N(—R)$_2$, —NH—CO—R, —N(—R)—CO—R, —P(=O)(—OH)—O—R and —P(=O)(—O—R)$_2$. Each of the groups represented by R independently is a monovalent aliphatic group, a monovalent aromatic group or a monovalent heterocyclic group. Carboxyl, sulfo, the sulfuric ester group, phosphono and the phosphoric ester group can be dissociated, or can be in the form of a salt.

The polymer having side chains containing the dienophile structures preferably comprises a repeating unit represented by the formula (VI).

(VI)

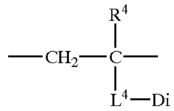

In the formula (IV), Di is a dienophile structure.

In the formula (IV), R$^4$ is hydrogen, a halogen atom (F, Cl, Br, I) or an alkyl group having 1 to 10 carbon atoms. R$^4$ preferably is hydrogen or an alkyl group having 1 to 6 carbon atoms, more preferably is hydrogen or an alkyl group having 1 to 3 carbon atoms, and most preferably is hydrogen or methyl.

In the formula (VI), L$^4$ is a single bond or a divalent linking group. The divalent linking group preferably is —CO—, —O—, —S—, —NH—, —SO$_2$—, an alkylene group, an arylene group or a combination thereof.

The alkylene group preferably has 1 to 12 carbon atoms, more preferably has 1 to 8 carbon atoms, and most preferably has 1 to 6 carbon atoms. The alkylene group can have a cyclic or branched structure. The alkylene group can have a substituent group. Examples of the substituent groups are the same as the substituent groups of the aliphatic groups.

The arylene group preferably is phenylene or naphthylene, more preferably is phenylene, and most preferably is p-phenylene. The arylene group can have a substituent group. Examples of the substituent groups are the same as the substituent groups of the aromatic groups.

Examples of $L^4$ are shown below. In each of the following examples, the left side is attached to the main chain, and the right side is attached to the dienophile structure (Di). In the examples, AL represents an alkylene group.

L30: single bond
L31: —O—
L32: —CO—O—
L33: —CO—O—AL—
L34: —CO—O—AL—O—
L35: —CO—O—AL—O—CO—
L36: —CO—NH—
L37: —CO—NH—AL—O—
L38: —CO—NH—AL—NH—

Examples of the repeating units having a dienophile structure are shown below.

(VI-1)

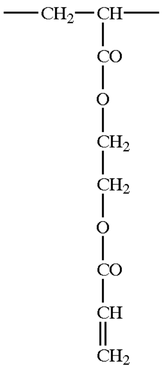

(VI-2)

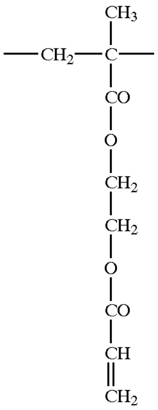

-continued (VI-3)

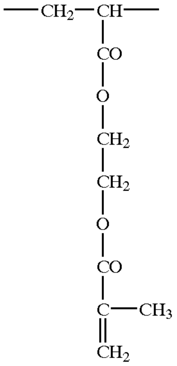

(VI-4)

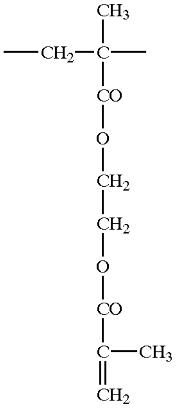

(VI-5)

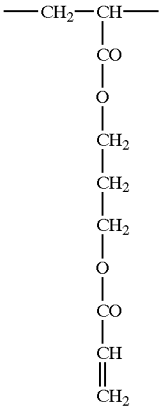

(VI-6)

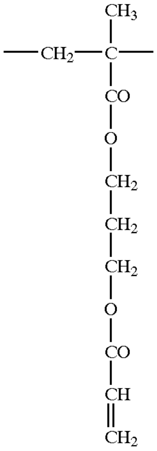

-continued
(VI-7)
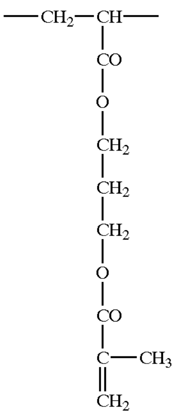
(VI-8)
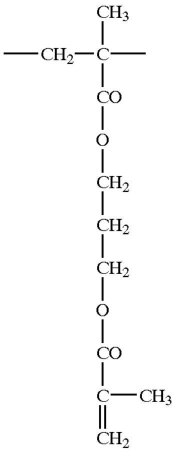
(VI-9)
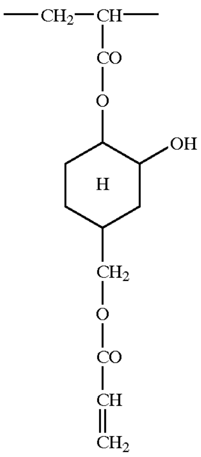
-continued
(VI-10)
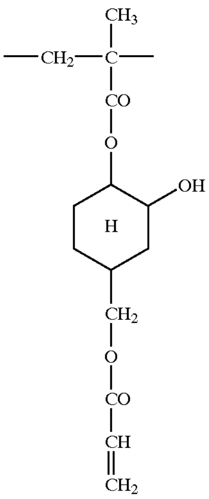
(VI-11)
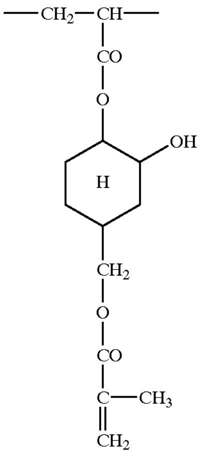
(VI-12)
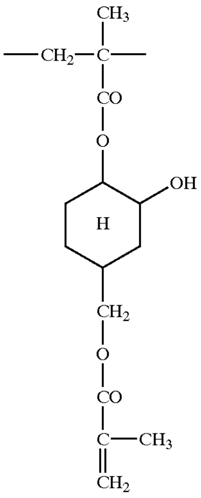

-continued
(VI-13)
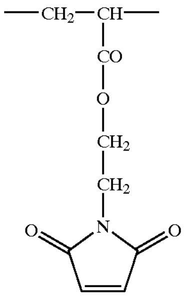
(VI-14)
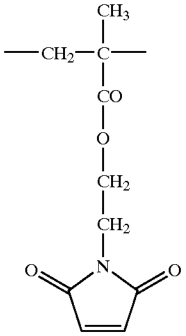
(VI-15)
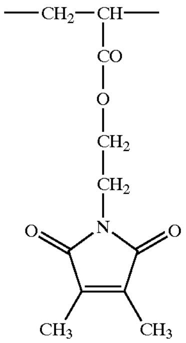
(VI-16)
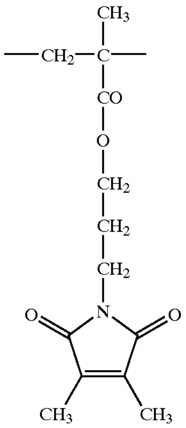
-continued
(VI-17)
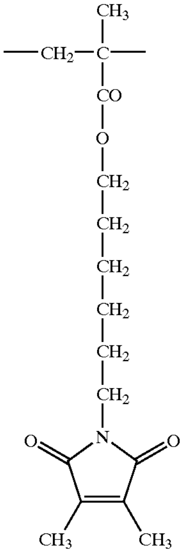
(VI-18)
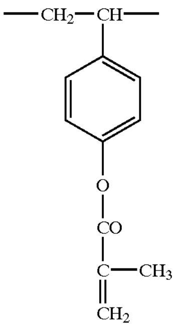
(VI-19)
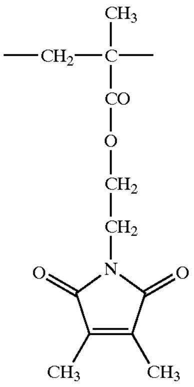

-continued (VI-20)

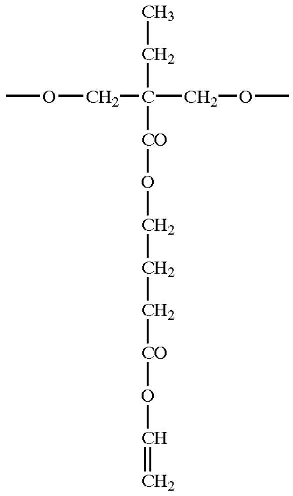

The polymer can be a homopolymer consisting of a repeating unit having a dienophile structure. The polymer can also be a copolymer comprising two or more repeating units having a dienophile structure. Further, the hydrophobic polymer can be a copolymer comprising a repeating unit having a dienophile structure and another repeating unit.

Examples of the other repeating units are shown below.

(VII-1)

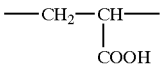

(VII-2)

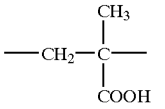

(VII-3)

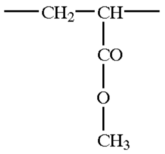

(VII-4)

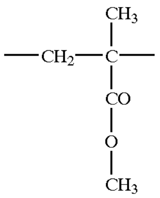

(VII-5)

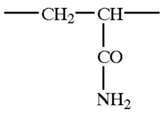

(VII-6)

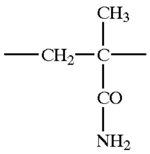

-continued (VII-7)

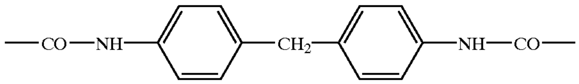

(VII-8)

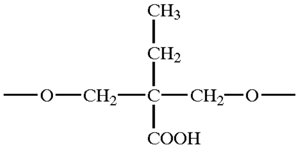

(VII-9)

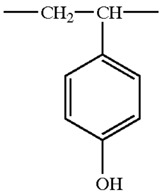

In the case where the unheated area of the image-forming layer is removed with an alkaline developing solution, the polymer preferably has an acidic group. The polymer more preferably comprises a repeating unit having an acidic group in addition to a repeating unit having a dienophile structure. The acidic group preferably is carboxyl (shown in VII-1, VII-2, VII-8) or carboxylic anhydride.

In the case where the copolymer consists of the repeating unit having a dienophile structure and another repeating unit (which does not has the dienophile structure), the molar ratio of the former repeating unit to the latter repeating unit is preferably in the range of 5/95 to 99/1, more preferably in the range of 10/90 to 98/2, and further preferably in the range of 20/80 to 97/3.

Examples of the copolymer are shown below. In each of the following examples, the number in the parentheses represents the corresponding repeating unit shown above. The ratio of the repeating unit is in terms of mol. %.

In the case where the copolymer consists of the repeating unit having dienophile structure and the repeating unit not having that structure, the molar ratio of the former repeating unit/the latter repeating unit is in the range of preferably 5/95 to 99/1, more preferably 10/90 to 98/2, further preferably 20/80 to 97/3.

Examples of the above copolymer are shown below. In each of the following examples, the number in the parentheses represents the corresponding repeating unit shown above. The ratio of each repeating unit is in terms of mol. %.

| | | | | |
|---|---|---|---|---|
| CP101: | -(VI-2)$_{80}$- | -(VII-2)$_{20}$- | | |
| CP102: | -(VI-8)$_{30}$- | -(VII-4)$_{50}$- | -(VII-2)$_{20}$- | |
| CP103: | -(VI-8)$_{30}$- | -(VII-4)$_{40}$- | -(VII-6)$_{20}$- | -(VII-2)$_{10}$- |
| CP104: | -(VI-10)$_{30}$- | -(VII-4)$_{50}$- | -(VII-2)$_{20}$- | |
| CP105: | -(VI-14)$_{70}$- | -(VII-2)$_{30}$- | | |
| CP106: | -(VI-17)$_{62}$- | -(VII-2)$_{38}$- | | |
| CP107: | -(VI-20)$_{35}$- | -(VII-8)$_{15}$- | -(VII-7)$_{50}$- | |

The polymer can be synthesized through a polymerization reaction of the monomers (generally, ethylenically unsaturated monomers), which correspond to the above-described repeating units. Examples of the polymerization reaction include a radical polymerization reaction, a cationic polymerization reaction and an anionic polymerization reaction. The dienophile structure can be introduced into the polymer after the main chain of polymer is synthesized.

In the case that the main chain is not hydrocarbon (for example, polyurethane), the polymer can also be synthesized according to a conventional polymerization reaction (for example, urethane polymerization reaction).

The polymer having the dienophile structure has a weight average molecular weight preferably in the range of 500 to 1,000,000, more preferably in the range of 1,000 to 500,000, further preferably in the range of 2,000 to 200,000, and most preferably in the range of 5,000 to 100,000.

The amount of the compound having two or more dienophile structures is determined in consideration of the ratio between the number of dienophile structures and the number of o-quinodimethane structures or precursor structures thereof.

[Hydrophilic Polymer]

In the case where the hydrophobic polymer is used in the form of fine particles, a hydrophilic polymer is preferably contained as a binder of the particles dispersed in the image-forming layer.

The hydrophilic polymer preferably has hydroxyl, carboxyl, sulfo, amino or an amido bond as a hydrophilic group. Carboxyl and sulfo can be in the form of salt.

Various natural, semi-synthetic or synthetic polymers can be used as the hydrophilic polymer.

Examples of the natural or semi-synthetic polymers include polysaccharides (e.g., gum arabic, starch derivatives, carboxymethyl cellulose, sodium salt thereof, cellulose acetate, sodium alginate) and proteins (e.g., casein, gelatin).

Examples of the synthetic polymers having hydroxyl as the hydrophilic group include polyhydroxyethyl methacrylate, polyhydroxyethyl acrylate, polyhydroxypropyl methacrylate, polyhydroxypropyl acrylate, polyhydroxybutyl methacrylate, polyhydroxybutyl acrylate, polyallylalcohol, polyvinylalcohol and poly-N-methylolacrylamide.

Examples of the synthetic polymers having carboxyl as the hydrophilic group include polymaleic acid, polyacrylic acid, polymethacrylic acid and salts thereof.

Examples of the synthetic polymers having other hydrophilic groups (e.g., amino, many ether bonds, hydrophilic heterocyclic groups, amido bond, sulfo) include polyethylene glycol, polyvinyl formal, polyvinyl butyral, polyvinylpyrrolidone, acrylamide, methacrylamide, 2-acrylamido-2-methylpropanesuldonic acid and a salt thereof.

The hydrophilic polymer can be a copolymer comprising two or more hydrophilic repeating units of the above-mentioned hydrophilic synthetic polymers. The hydrophilic polymer can also be a copolymer comprising the hydrophilic repeating unit and a hydrophobic repeating unit (for example, repeating units of polyvinyl acetate or polystyrene). Examples of the copolymers include vinyl acetate-maleic acid copolymer, styrene-maleic acid copolymer and vinyl alcohol-vinyl acetate copolymer (partially saponified polyvinyl acetate). In the case where polyvinyl acetate is partially saponified into the vinyl alcohol-vinyl acetate copolymer, the saponification degree preferably is not less than 60%, and more preferably is not less than 80%.

Two or more hydrophilic polymers can be used in combination.

The image-forming layer contains the hydrophilic polymer preferably in an amount of 2 to 40 wt. %, and more preferably in an amount of 3 to 30 wt. %.

[Agent Capable of Converting Light to Heat]

The image-forming layer preferably contains an agent capable of converting light to heat. The converting agent absorbs light and converts the energy of light into thermal energy to generate heat.

The agent capable of converting light to heat can be incorporated into the particles of hydrophobic polymer. The agent can also be placed outside of the particles (incorporated into the hydrophilic binder).

The agent preferably absorbs light having the maximum absorption in the wavelength region of 700 nm or longer (infrared light). An infrared absorbing pigment, an infrared absorbing dye and metal fine particles are preferably used as the converting agent.

The infrared absorbing pigments are described in "Handbook of Color Index (CI)", "Latest Handbook of pigments (written in Japanese)", 1977, edited by Japan Association of Pigment Technology, "Latest Application Technology of Pigment (written in Japanese)", 1986, published by CMC, and "Technology of Printing Ink (written in Japanese)", 1984, published by CMC.

Carbon black is the most preferred infrared absorbing pigment.

In the case where the infrared absorbing pigment is added in the hydrophobic polymer or incorporated into the particles of the polymer, the pigment can be subjected to a hydrophobic (oleophilic) treatment. For example, a surface of the pigment can be coated with an oleophilic resin.

In the case where the infrared absorbing pigment is dispersed in a hydrophilic polymer, the pigment can be subjected to a hydrophilic treatment. For example, a surface of the pigment can be coated with a hydrophilic resin. A surface active agent can be adsorbed onto the pigment surface to form a hydrophilic surface. A reactive hydrophilic substance (e.g., silica sol, alumina sol, a silane coupling agent, an epoxy compounds, an isocyanate compound) can be combined with the pigment to form a hydrophilic surface.

The pigment has a particle size preferably in the range of 0.01 to 1 μm, and more preferably in the range of 0.01 to 0.5 μm.

The pigment particles can b dispersed in the hydrophilic polymer according to a conventional dispersing method for producing printing ink or toner.

The infrared absorbing dyes are described in "Handbook of Dyes (written in Japanese)", 1970, edited by Association of Organic Synthetic Chemistry, "Chemical Industry (written in Japanese)", May 1986, pp.45–51, the article titled "Near Infrared Absorbing Dyes", and "Development and Market of functional dyes in 1990", 1990, Chapter 2, Sections 2 and 3, published by CMC.

Examples of the infrared absorbing dyes include azo dyes, metal complex salt azo dyes, pyrazolone azo dyes, naphthoquinone dyes (described in Japanese Patent Provisional Publication Nos. 58(1983)-112793, 58(1983)-224793, 59(1984)-48187, 59(1984)-73996, 60(1985)-52940 and 60(1985)-63744), anthraquinone dyes, phthalocyanine dyes (described in Japanese Patent Provisional Publication No. 11(1999)-235883), squarilium dyes (described in Japanese Patent Provisional Publication No. 58(1983)-112792), pyrylium dyes (U.S. Pat. Nos. 3,881,924, 4,283,475, Japanese Patent Provisional Publication Nos. 57(1982)-142645, 58(1983)-181051, 58(1983)-220143, 59(1984)-41363, 59(1984)-84248, 59(1984)-84249, 59(1984)-146063, 59(1984)-146061, Japanese Patent Publication Nos. 5(1993)-13514 and 5(1993)-19702), carbonium dyes, quinoneimine dyes and methine dyes (described in Japanese Patent Provisional Publication Nos. 58(1983)-173696, 58(1983)-181690 and 58(1983)-194595).

The infrared absorbing dye is also described in U.S. Pat. Nos. 4,756,993, 5,156,938 and Japanese Patent Provisional Publication No. 10(1998)-268512.

The infrared absorbing dyes are commercially available (e.g., EPOLIGHT III-178, III-130, III-125, EPOLINE).

Methine dyes are preferred. Cyanine dyes (described in British Patent No. 434,875, U.S. Pat. No. 4,973,572, Japanese Patent Provisional Publication Nos. 58(1983)-125246, 59(1984)-84356, 59(1984)-216146 and 60(1985)-78787) are more preferred. The cyanine dye is defined by the following formula.

Bo—Lo=Bs (Cyanine dye)

In the formula, Bs is a basic nucleus, Bo is an onium form of a basic nucleus, and Lo is a methine chain consisting of an odd number of methines. In the infrared absorbing methine dye, Lo preferably is a methine chain consisting of seven methines.

A hydrophilic dye is preferably used in the case where the infrared absorbing dye is added in a hydrophilic polymer of an image-forming layer. Examples of the hydrophilic infrared absorbing dye are shown below.

(IR-1)

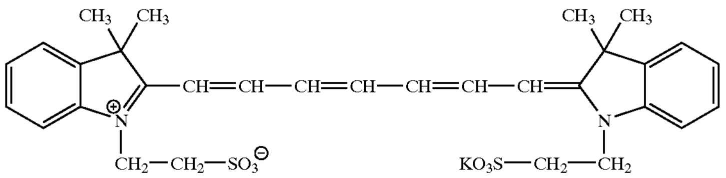

(IR-2)

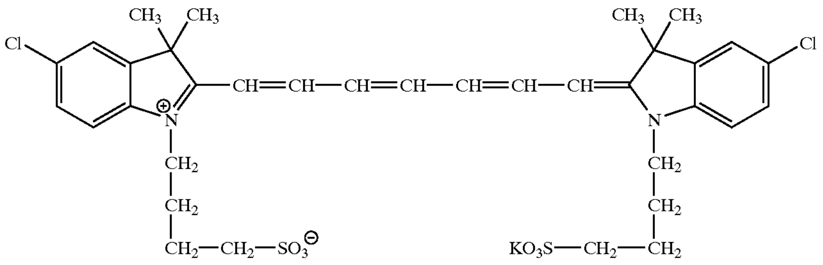

(IR-3)

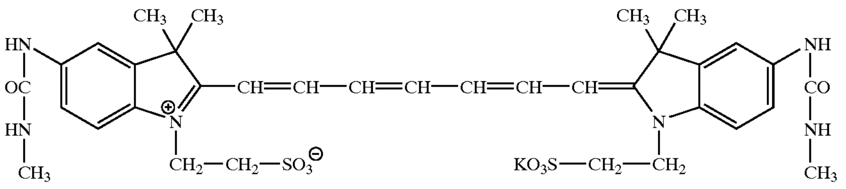

(IR-4)

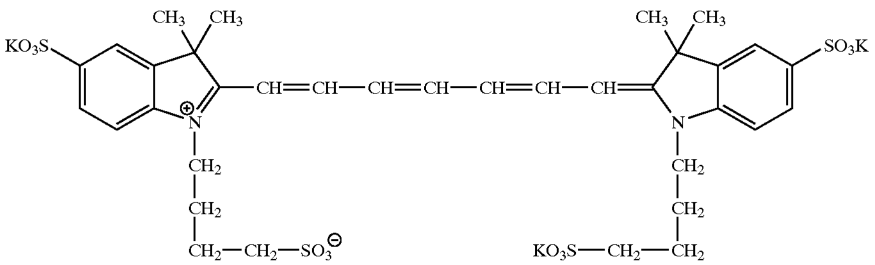

(IR-5)

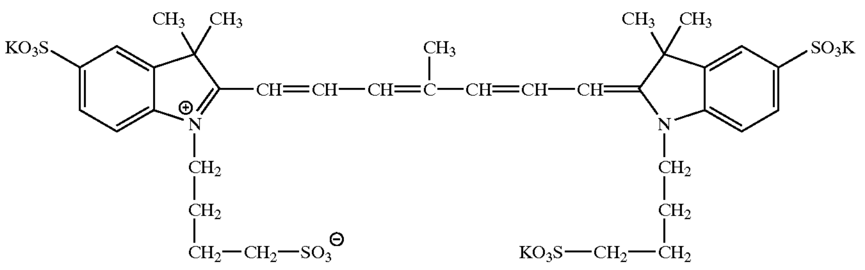

-continued
(IR-6)
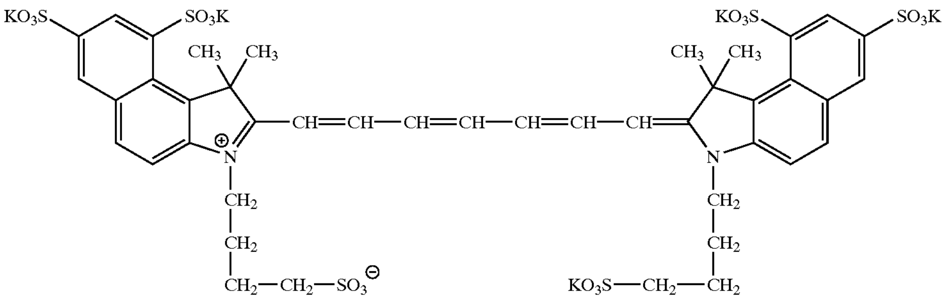
(IR-7)
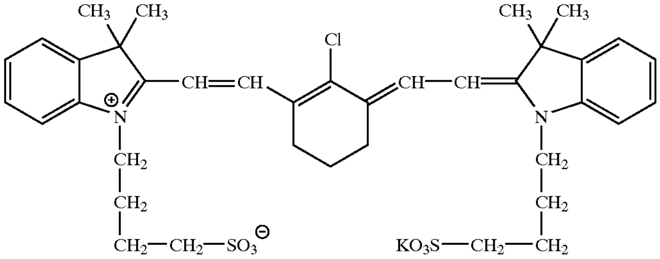
(IR-8)
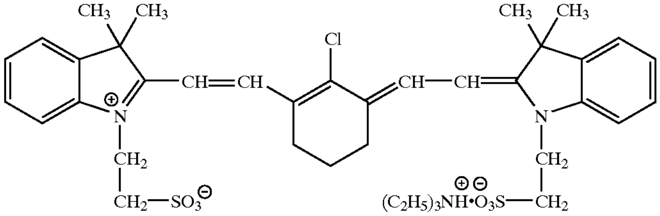
(IR-9)
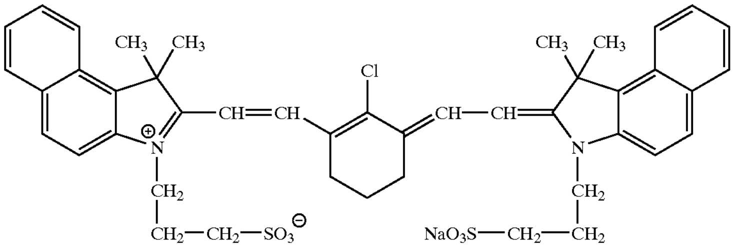
(IR-10)
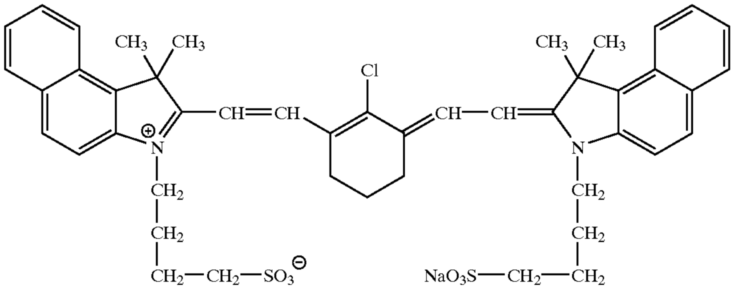

-continued
(IR-11)
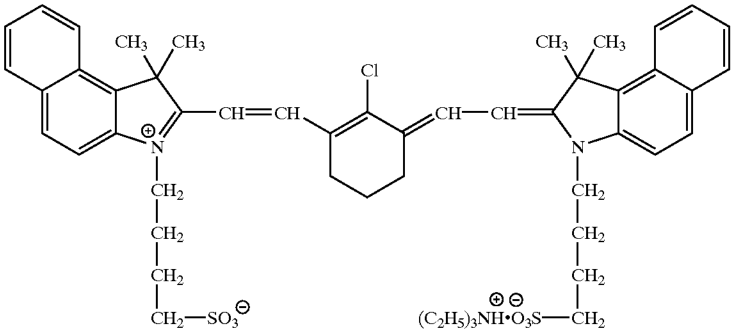
A relatively hydrophobic dye is preferably used in the case where the infrared absorbing dye is incorporated into particles of a hydrophobic polymer. Examples of the hydrophobic infrared absorbing dye are shown below.
(IR-21)
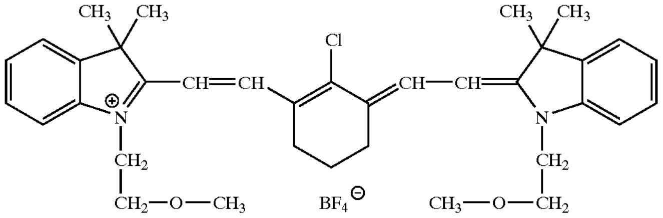
(IR-22)
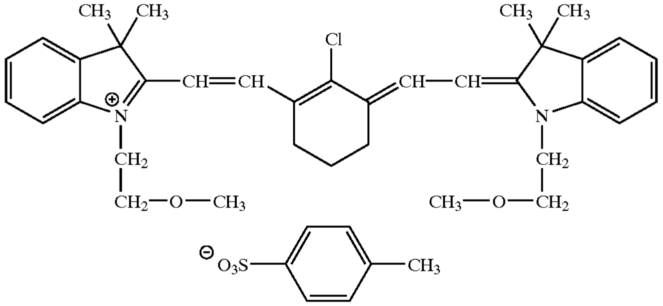
(IR-23)
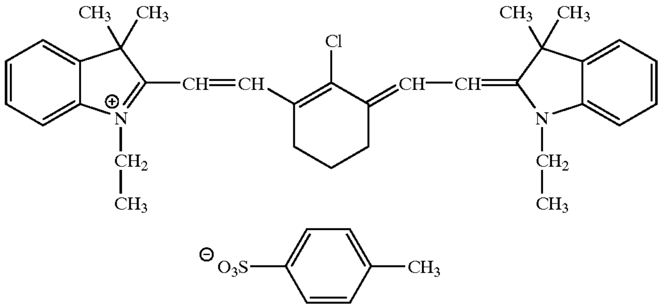
(IR-24)
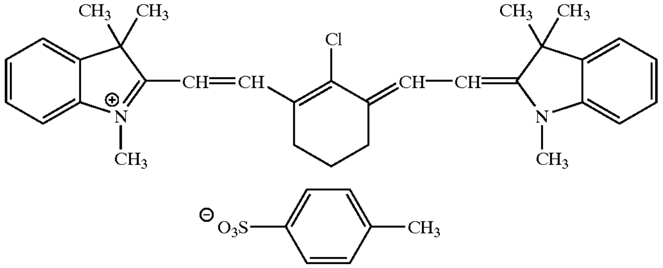

-continued (IR-25)

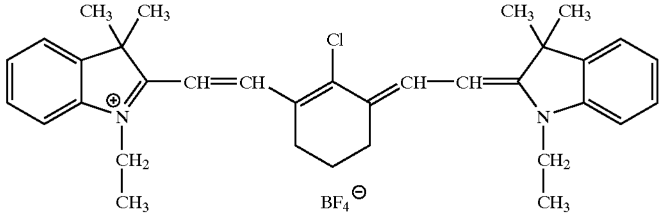

(IR-26)

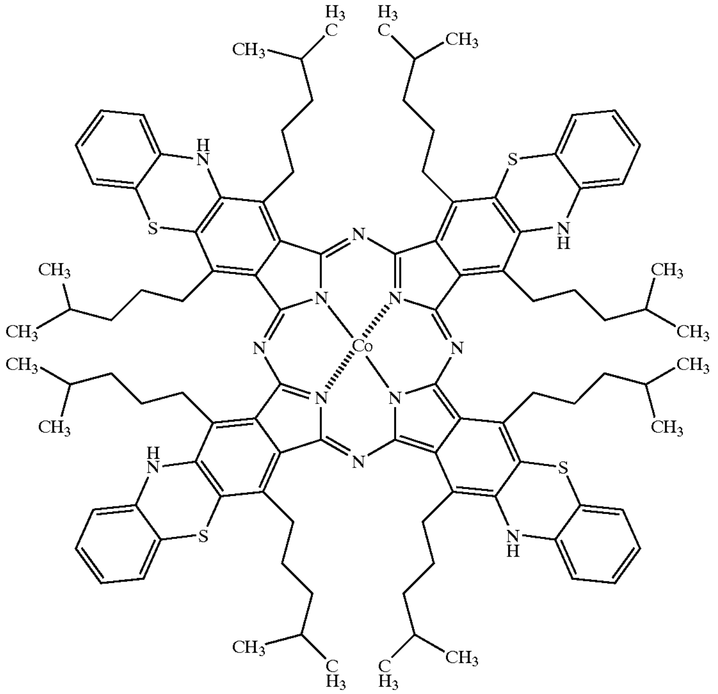

(IR-27)

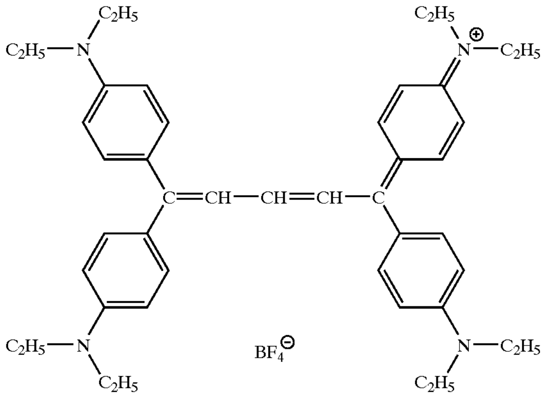

Metals generally have self-exothermic property. Accordingly, metals absorbing infrared, visible or ultraviolet (particularly, infrared) light is capable of converting light to heat.

The metal used in the form of fine particles is preferably melted and agglomerated by heat. The metal preferably has a melting point of 1,000° C. or below.

Examples of the metals forming the fine particles include Si, Al, Ti, V, Cr, Mn, Fe, Co, Ni, Cu, Zn, Y, Zr, Mo, Ag, Au, Pt, Pd, Rh, In, Sn, W, Te, Pb, Ge, Re, Sb and alloys thereof. Re, Sb, Te, Ag, Au, Cu, Ge, Pb and Sn are preferred, Ag, Au, Cu, Sb, Ge and Pb are more preferred, and Ag, Au and Cu are most preferred.

Alloys of metals can comprise a metal having low melting point (e.g., Re, Sb, Te, Au, Ag, Cu, Ge, Pb, Sn) and a highly self-exothermic metal (e.g., Ti, Cr, Fe, Co, Ni, W, Ge). Fine particles of metals highly absorbing light (e.g., Ag, Pt, Pb) can be used in combination with fine particles of other metals.

The metal fine particles are preferably subjected to a hydrophilic surface treatment, and dispersed in a hydrophilic polymer. Examples of the hydrophilic surface treatments include a surface treatment with hydrophilic material (e.g., surface active agent), a surface chemical reaction with hydrophilic material and a formation of (protective colloidal) hydrophilic polymer coating film. The surface chemical reaction with hydrophilic material is preferred, and a surface silicate treatment is most preferred. In the surface silicate treatment for iron fine particles, the particles are immersed in 3 wt. % aqueous solution of sodium silicate at 70° C. for 30 seconds to form a hydrophilic surface on the particles. The fine particles of other metals can also be subjected to the surface silicate treatment in a similar manner.

Fine particles of metal oxides or metal sulfides can be used in place of the metal fine particles.

The fine particles have sizes preferably of not more than 10 μm, more preferably in the range of 0.003 to 5 μm, and most preferably in the range of 0.01 to 3 μm.

[Other Optional Components in Image-forming Layer]

The image-forming layer may contain a colorant. The imaging area containing the colorant can be easily distinguished from the non-imaging area after the image is formed. The colorant is a dye or pigment having a large absorption band within the visible region. Examples of the colorants include Oil Yellow #101, Oil Yellow #103, Oil Pink #312, Oil Green BG, Oil Blue BOS, Oil Blue #603, Oil Black BY, Oil Black BS and Oil Black T-505 (from Orient Chemical Industries Co., ltd); Victoria Pure Blue, Crystal Violet (CI42555), Methyl Violet (CI42535), Ethyl Violet, Rhodamine B (CI145170B), Malachite Green (CI42000) and Methylene Blue (CI52015). Dyes usable as the colorant are described in Japanese Patent Provisional Publication No. 62(1987)-293247. Further, inorganic pigments such as titanium oxide can be also used as the colorant.

The amount of the colorant is preferably in the range of 0.01 to 10 wt. % based on the amount of the image-forming layer.

The image-forming layer may contain a nonionic surface active agent (described in Japanese Patent Provisional Publication Nos. 62(1987)-251740 and 3(1991)-208514) or an amphoteric surface active agent (described in Japanese Patent Provisional Publication Nos. 59(1984)-121044 and 4(1992)-13149) to improve stability for press development.

Examples of the nonionic surface active agents include sorbitan tristearate, sorbitan monopalmitate, sorbitan trioleate, stearic monoglyceride and polyoxyethylene noneylphenyl ether. Examples of the amphoteric surface active agents include an alkyldi(aminoethyl)glycine, a hydrochloric salt of an alkylpolyaminoethylglycine, an 2-alkyl-N-carboxyethyl-N-hydroxyethylimidazoliniumbetaine and an N-tetradecyl-N,N-betaine type surface active agent (Amorgen K, Dai-ichi Kogyo Co., Ltd.).

The amount of the nonionic or amphoteric surface active agent is preferably in the range of 0.05 to 15 wt. %, and more preferably in the range of 0.1 to 5 wt. % based on the amount of the image-forming layer.

A plasticizer may be added to make the image-forming layer flexible. Examples of the plasticizers include polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate.

[Formation of Image-forming Layer]

The image-forming layer can be formed by the steps of dissolving, dispersing or emulsifying the components in an appropriate solvent to prepare a coating solution, coating the solution on a support, and drying it to remove the solvent. Examples of the solvents include ethylene dichloride, cyclohexane, methyl ethyl ketone, methanol, ethanol, propanol, ethylene glycol monomethyl ether, 1-methoxy-2-propanol, 2-methoxyethyl acetate, 1-methoxy-2-propylacetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butylolactone, toluene and water. Two or more solvents can be used in combination.

The solid content in the coating solution is preferably in the range of 1 to 50 wt. %.

The coating solution can contain a surface active agent to be easily applied on the support. The surface active agent preferably is a fluorine-containing surface active agent (described in Japanese Patent Provisional Publication No. 62(1987)-170950). The amount of the surface active agent is preferably in the range of 0.01 to 1 wt. %, more preferably in the range of 0.05 to 0.5 wt. % based on the solid content.

The dry coating amount of the image-forming layer is preferably in the range of 0.5 to 5.0 $g/m^2$.

[Hydrophilic Support]

The hydrophilic support can be made of metal, plastic or paper. The support preferably is a surface-treated aluminum plate, a hydrophilic treated plastic film or a water-proofed paper. The support more preferably is an aluminum plate subjected to anodic oxidation, a polyethylene terephthalate film provided with a hydrophilic layer and a paper laminated with a polyethylene film.

The aluminum plate subjected to anodic oxidation is particularly preferred.

The aluminum plate can be a plate of pure aluminum, or an alloy plate comprising the main component of aluminum and a little amount of other metals. Examples of the metals other than aluminum include Si, Fe, Mn, Co, Mg, Cr, Zn, Bi, Ni and Ti. The amount of the other metals is preferably 10 wt. % or less. An aluminum plate for printing plate is commercially available.

The aluminum plate has a thickness preferably in the range of 0.05 to 0.6 mm, more preferably in the range of 0.1 to 0.4 mm, and most preferably in the range of 0.15 to 0.3 mm.

The surface of the aluminum plate is preferably subjected to a roughing treatment. The roughing treatment can be mechanically, electrochemically or chemically conducted. Examples of the mechanical roughing treatments include a ball grinding treatment, a brush grinding treatment, a blast grinding treatment and a buff grinding treatment. The electrochemical roughing treatment can be conducted by a process, in which a direct or alternative current is applied to the plate in an electrolysis solution containing an acid such as hydrochloric acid or nitric acid. The electrolytic roughing treatment can be conducted in a mixture of two or more acids (described in Japanese Patent Provisional Publication No. 54(1979)-63902). The chemical roughing treatment can be conducted by a process, in which the aluminum plate is preferably immersed in a saturated aqueous solution of aluminum salt with mineral acid (described in Japanese Patent Provisional Publication No. 54(1979)-31187).

After the roughing treatment, the aluminum plate preferably has a surface roughness of Ra (average along the central line) in the range of 0.2 to 1.0 μm.

After the roughing treatment, the aluminum plate can be subjected to an alkali etching treatment. The alkali etching solution preferably is an aqueous solution of potassium hydroxide or sodium hydroxide. A neutralizing treatment is preferably conducted after the alkali etching treatment.

The aluminum plate is preferably subjected to an anodic oxidation treatment to improve an abrasion resistance of the support.

The anodic oxidation treatment can use various electrolytes to form a porous oxide film. Examples of the electrolytes include sulfuric acid, hydrochloric acid, oxalic acid, chromic acid, and mixtures thereof.

The anodic oxidation treatment is generally conducted under the conditions that the concentration of the electrolytic solution is in the range of 1 to 80 wt. %, the temperature of the solution is in the range of 5 to 70° C., the electric current density is in the range of 5 to 60 A/$dm^2$, the voltage is in the range of 1 to 100 V and the time for electrolysis is in the range of 10 seconds to 5 minutes.

The oxide film formed by the anodic oxidation has a thickness preferably in the range of 1.0 to 5.0 g/$m^2$, and more preferably in the range of 1.5 to 4.0 g/$m^2$.

[Water-soluble Overcoating Layer]

A water-soluble overcoating layer can be provided on the image-forming layer to protect the surface of the image-forming layer from stain caused by an oleophilic substance.

The water-soluble overcoating layer is made of a substance that can easily be removed in printing. The substance preferably is a water-soluble organic polymer. Examples of the water-soluble organic polymers include polyvinyl alcohol, polyvinyl acetate, polyacrylic acid, salts thereof with alkali metals and amines, polymethacrylic acid, salts thereof with alkali metals and amines, polyacrylamide, polyhydroxyethylacrylate, polyvinyl pyrrolidone, polyvinyl methyl ether, poly-2-acrylamice-2-methyl-1-propanesulfonic acid, salts thereof with alkali metals and amines, gum arabic, cellulose ethers (e.g., carboxymethyl cellulose, carboxyethyl cellulose, methyl cellulose), dextrin and derivatives thereof (e.g., white dextrin, dextrin decomposed with enzyme, etherized dextrin, pullulan).

The polymer can be a copolymer having two or more repeating units of water-soluble organic polymers. Examples of the copolymers include vinyl alcohol-vinyl acetate copolymer (partially saponified polyvinyl acetate) and vinyl methyl ether-maleic anhydride copolymer. In the case where the vinyl alcohol-vinyl acetate copolymer is prepared by partially saponifying polyvinyl acetate, the saponification degree is preferably 65% or more.

Two or more water-soluble organic polymers can be used in combination.

The overcoating layer can contain an agent capable of converting light to heat, which is described above. The converting agent contained in the overcoating layer preferably is water-soluble.

A coating solution for the overcoating layer can contain a nonionic surface active agent (e.g., polyoxyethylene nonylphenyl ether, polyoxyethylene dodecyl ether).

The coating amount of the overcoating layer is preferably in the range of 0.1 to 2.0 g/$m^2$.

[Imagewise Heating Step]

The presensitized lithographic printing plate is imagewise heated to form an image. The presensitized plate can be imagewise heated with a thermal recording head. The image formation using the thermal head does not require an agent capable of converting light to light.

The agent capable of converting light to heat is preferably used, since the thermal recording head generally gives an image with low resolution. An imagewise exposure of light generally gives an image of higher resolution.

The presensitized plate can be imagewise exposed to light through an original image (analog data). The presensitized plate can also be scanned with light corresponding to original image data (usually, digital data).

In the former analog exposure, the light source preferably is a xenon discharge lamp or an infrared lamp. A flash exposure can be conducted for a short time, where a high power lamp such as a xenon lamp is used as the light source.

In the latter scanning exposure, a laser, particularly an infrared laser, is generally used. The infrared laser preferably emits rays in the wavelength region of 700 to 1,200 nm. The laser preferably is a high power solid infrared laser (e.g., semiconductor laser, YAG laser).

When the image-forming layer containing a agent capable of converting light to heat is exposed to the scanning laser beam, the light energy of the beam is converted into thermal energy. A compound or polymer having o-quinodimethane structures or precursor structures thereof in the heated area (imaging area) of the presensitized plate is polymerized or cross-linked to harden the heated area. If the compound or polymer is contained in particles, the particles in the heated area are melted and fused to form a hydrophobic area on the hydrophilic support. On the other hand, the compound or polymer in the unheated area (non-imaging area) is not changed in the plate.

[Developing and Printing Steps]

The imagewise exposed plate is developed to form a lithographic printing plate.

In the case where particles are not used in the image-forming layer (where the image-forming layer is homogeneous), acidic groups are preferably introduced into a polymer in the layer to remove the unheated area (non-imaging area) by washed the plate with an alkali developing solution.

In the case where particles are contained-in the image-forming layer, the particles in the unheated area (non-imaging area) can be removed with water or an aqueous solution. The step of removing the particles (developing step) can be replaced with a press development. In the press development, the imagewise heated plate is installed in a printer, and subjected to usual printing treatments. The plate can be developed with the printing treatments using dampening water and ink, and successively a printing process is conducted by using the plate, the dampening water and the ink. The unheated area (non-imaging area) of the image-forming layer is removed with dampening water, ink or rubbing force of printing treatment, when the printer is worked.

The process can comprise the steps of: installing a presensitized lithographic plate on a cylinder of a printer, exposing the plate to a laser (emitted from a light source is attached to the printer), and subjecting the plate to press development with dampening water and ink. A printer equipped with a laser-exposing apparatus (disclosed in Japanese Patent No. 2,938,398) can be used to conduct the steps of exposure to printing successively.

After the development, the printing plate can be heated to cause a reaction of an un-reacted compound or polymer (which remains in the imaging area) to further improve the endurance (plate wear) of the printing plate.

EXAMPLE 1

(Preparation of Aluminum Support)

Melt of JIS A1050 alloy containing Al (99.5% or more), Fe (0.30%), Si (0.10%), Ti (0.02%) and Cu (0.013%) was cleaned and molded. For cleaning the melt, the melt was degassed to remove contaminating gases such as hydrogen gas, and then filtrated through a ceramic tube filter. For molding the melt, the DC molding was carried out. The solidified molded metal was a plate having 500 mm thickness. The plate was planed off by 10 mm, and then subjected to homogenizing treatment at 550° C. for 10 hours so that the intermetallic compounds might not agglomerate. After hot rolling at 400° C., the plate was annealed at 500° C. for 60 seconds in an annealing furnace. The plate was then subjected to cold rolling to obtain an aluminum plate having 0.30 mm thickness. The surface of the rolling mill was beforehand controlled to have such roughness that the aluminum plate might have a central surface roughness (Ra) of 0.2 μm. The aluminum plate was then installed in a tension leveler.

The obtained plate was subjected to surface treatment for a lithographic printing plate.

First, the plate was subjected to oil-removing treatment with a 10 wt. % aqueous solution of sodium aluminate at 50° C. for 30 seconds to remove the rolling oil on the surface of the plate. The plate was then neutralized with a 30 wt. % aqueous solution of sulfuric acid at 50° C. for 30 seconds, and the smut was removed.

Next, for improving adhesion between the support and the image-forming layer and for increase water-holding capacity of the non-imaging area, the plate surface was subjected to roughing treatment (what is called sand roughing). In an aqueous solution containing 1 wt. % nitric acid and 0.5 wt. % aluminum nitrate at 45° C., the plate was subjected to electrolytic sand roughing treatment. In the treatment, while an aluminum web was left in the solution, an indirect power cell supplied an alternative current under the conditions of the electric current density of 20 $A/dm^2$, the duty ratio of 1:1 and the anodic electricity of 240 $C/dm^2$. After the treatment, the plate was subjected to etching treatment with a 10 wt. % aqueous solution of sodium aluminate at 50° C. for 30 seconds. The plate was then neutralized with a 30 wt. % aqueous solution of sulfuric acid at 50° C. for 30 seconds, and the smut was removed.

Further, an oxide film was formed on the support by anodic oxidation to improve abrasion resistance, chemical resistance and water-holding capacity. An indirect power cell supplied a direct current of 14 $A/dm^2$ to electrolyze for forming an[]oxide film of 2.5 $g/m^2$, while an aluminum web was left in a 20% aqueous solution of sulfuric acid at 35° C.

The plate was subjected to silicate treatment as a hydrophilic treatment for the non-imaging area. In the treatment, the plate was made contact with an aluminum web for 15 seconds in a 1.5% aqueous solution of sodium silicate (No. 3) at 70° C., and washed with water. The amount of attached Si was 10 $mg/m^2$. The prepared support had a surface roughness (Ra) measured along the central line of 0.25 μm (Formation of Undercoating Layer)

The following coating solution was applied in the amount of 10 $g/m^2$, and dried at 80° C. for 30 seconds on the aluminum support to form an undercoating layer.

| Coating solution for undercoating layer | |
|---|---|
| β-Alanine | 0.10 g |
| Methanol | 40 g |
| Pure water | 60 g |

(Preparation of carbon black dispersion)
The following composition was dispersed with glass beads for 10 minutes, to prepare carbon black dispersion.
Carbon black dispersion

| | |
|---|---|
| Carbon black (particle size: 0.2 to 0.3 μm) | 1.0 weight part |
| Benzyl methacrylate/methacrylic acid copolymer (molor ratio: 72/29, weight average molecular weight: 70,000) | 1.6 weight part |
| Methyl ether ketone | 4.0 weight parts |
| 1-Methoxy-2-propanol | 4.0 weight parts |

-continued (Formation of image-forming layer)
The coating solution consisting of the following components was prepared.
Coating solution for image-forming layer

| | |
|---|---|
| The carbon black dispersion | 2.4 g |
| The compound having benzocyclobutene structures (I-1) | 1.65 g |
| Copolymer CP101 (weight average molecular weight: 50,000) | 3.3 g |
| Fluorine-containing surface active agent (Megaface F-177, Dainippon Ink & Chemicals, Inc.) | 0.05 g |
| Methyl ethyl ketone | 24 g |
| 2-Methoxy-1-propanol | 24 g |

(CP101)

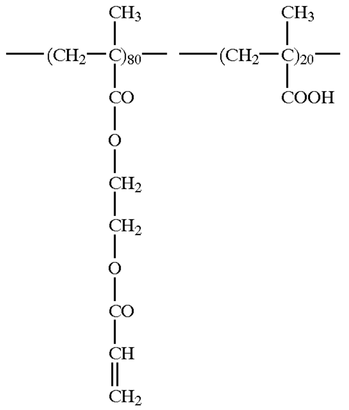

The coating solution for the image-forming layer was applied on the undercoating layer on the aluminum support, and dried at 70° C. for 5 minutes to form the image-forming layer having a dried weight of 1.2 $g/m^2$.

A presensitized lithographic printing plate was prepared.

(Preparation of Plate, Print and Evaluation)

The above-produced presensitized plate was imagewise exposed in an image setter (Trendsetter 3244VFS, Creo) equipped with a water-cooling semiconductor infrared laser of 40 W. The exposing conditions were the laser power of 9 V, the outer drum rotation of 210 rpm, the plate surface energy of 400 $mJ/m^2$ and the resolution of 2,400 dpi. The plate was then processed through an automatic developing machine using an alkaline developer of pH 13 and a rinsing solution. The alkaline developer was obtained by diluting a commercially available developer (DP-4 developer, Fuji Photo Film Co., Ltd.) at the diluting ratio of 1:10. The rinse solution was obtained by diluting a commercially available rinse (FR-3, Fuji Photo Film Co., Ltd.) at the diluting ratio of 1:7. Thus, a clear negative image was obtained.

The obtained lithographic printing plate was installed in a printer (SOR-KZ, Hydel), and printing was carried out to obtain a clear print. The plate wear was 10,000 sheets.

EXAMPLES 2 TO 7

The procedure of Example 1 was repeated except that the, benzocyclobutene compound and the dienophile polymer set forth in Table 1 were used in the coating solution for the image-forming layer to produce a presensitized printing plate. A printing plate was produced from the obtained presensitized plate, and then printing-was carried out to evaluate the plate. The results are set forth in Table 1.

TABLE 1

| PS plate | Benzo-cyclobutene compound | Dienophile polymer (weight average molecular weight) amount | Plate wear (number of printed sheets) |
|---|---|---|---|
| Ex. 1 | I-1 | CP101 (50,000) 3.3 g | 10,000 |
| Ex. 2 | I-3 | CP101 (50,000) 3.3 g | 12,000 |
| Ex. 3 | I-7 | CP102 (70,000) 3.3 g | 12,000 |
| Ex. 4 | I-13 | CP102 (70,000) 3.3 g | 11,000 |
| Ex. 5 | I-22 | CP102 (80,000) 3.3 g | 10,000 |
| Ex. 6 | I-27 | CP101 (50,000) 3.3 g | 12,000 |
| Ex. 7 | I-2 | CP106 (80,000) 3.3 g | 13,000 |

(CP102)

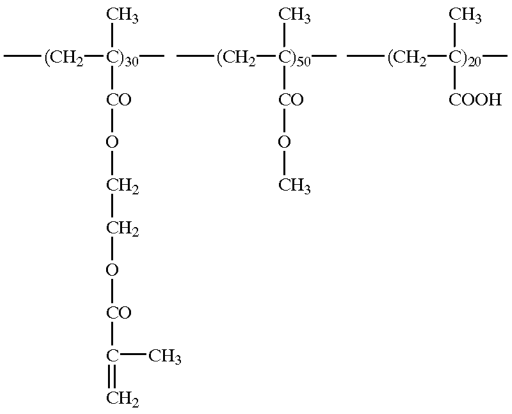

(CP106)

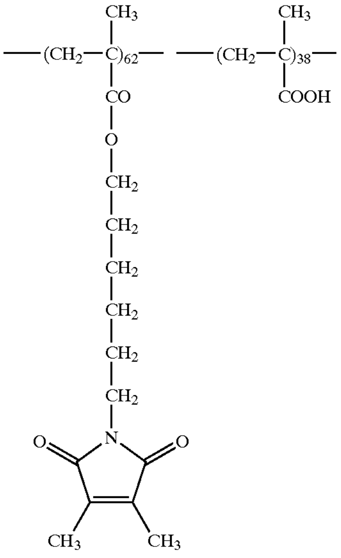

EXAMPLE 8

(Formation of Image-forming Layer)

The coating solution consisting of the following components was prepared.

| Coating solution for image-forming layer | |
|---|---|
| Infrared absorbing dye (IR-28) | 0.45 g |
| The compound having benzocyclobutene structures (I-1) | 1.65 g |
| Copolymer CP101 (weight average molecular weight: 50,000) | 3.3 g |

-continued

| Coating solution for image-forming layer | |
|---|---|
| Fluorine-containing surface active agent (Megaface F-177, Dainippon Ink & Chemicals, Inc.) | 0.05 g |
| Methyl ethyl ketone | 24 g |
| 2-Methoxy-1-propanol | 24 g |

The coating solution for the image-forming layer was applied on the undercoating layer formed on the aluminum support prepared in Example 1, and dried at 70° C. for 5 minutes to form the image-forming layer having a dried weight of 1.2 g/$m^2$.

A presensitized lithographic printing plate was prepared.

(Preparation of Plate, Print and Evaluation)

The above-produced presensitized plate was imagewise exposed in an image setter (Trendsetter 3244VFS, Creo) equipped with a water-cooling semiconductor infrared laser of 40 W. The exposing conditions were the laser power of 9 V, the outer drum rotation of 210 rpm, the plate surface energy of 400 mJ/$m^2$ and the resolution of 2,400 dpi. The plate was then processed through an automatic developing machine using an alkaline developer of pH 13 and a rinsing solution. The alkaline developer was obtained by diluting a commercially available developer (DP-4 developer, Fuji Photo Film Co., Ltd.) at the diluting ratio of 1:8. The rinse solution was obtained by diluting a commercially available rinse (FR-3, Fuji Photo Film Co., Ltd.) at the diluting ratio of 1:7. Thus, a clear negative image was obtained.

The obtained lithographic printing plate was installed in a printer (HYDEL SOR-KZ), and printing was carried out to obtain a clear print. The plate wear was 11,000 sheets.

EXAMPLES 9 TO 14

The procedure of Example 8 was repeated except that the benzocyclobutene compound and the dienophile polymer or compound set forth in Table 2 were used in the coating solution for the image-forming layer to produce a presensitized printing plate. A printing plate was produced from the obtained presensitized plate, and then printing was carried out to evaluate the plate. The results are set forth in Table 2.

TABLE 2

| PS plate | Benzo-cyclo-butene compound | Dienophile compound, amount + dienophile polymer (weight average molecular weight) amount | Plate wear |
|---|---|---|---|
| Ex. 8 | I-1 | None + CP102 (70,000) 3.3 g | 11,000 |
| Ex. 9 | I-2 | V-9, 1.1 g + CP102 (70,000) 3.3 g | 12,000 |
| Ex. 10 | I-5 | None + CP103 (70,000) 3.3 g | 12,000 |
| Ex. 11 | I-7 | None + CP103 (70,000) 3.3 g | 10,000 |
| Ex. 12 | I-21 | None + CP102 (80,000) 3.3 g | 12,000 |
| Ex. 13 | I-26 | None + CP101 (50,000) 3.3 g | 11,000 |
| Ex. 14 | I-1 | None + CP107 (100,000) 3.3 g | 14,000 |

TABLE 2-continued

| PS plate | Benzo-cyclo-butene compound | Dienophile compound, amount + di-enophile polymer (weight average molecular weight) amount | Plate wear |
|---|---|---|---|

(CP103)

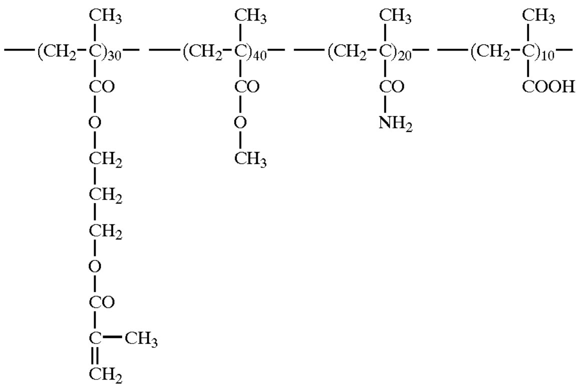

(CP107)

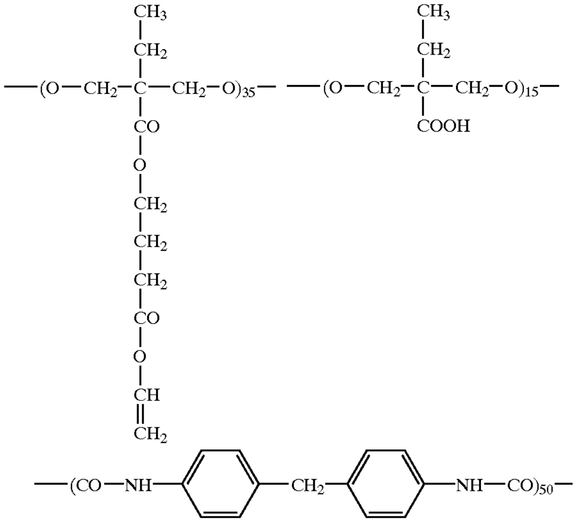

EXAMPLE 15

(Preparation of Hydrophobic Polymer Particle Dispersion)

In a mixture of 7.4 g of methyl ethyl ketone and 13.7 g of ethyl acetate, 2 g of the compound having benzocyclobutene structures (I2), 4 g of the dienophile copolymer (CP103), 1.5 g of the infrared absorbing dye (IR-28) and 0.1 g of an anionic surface active agent (BIONINE A-41C, Takemoto Yushi Co., Ltd.) were dissolved. The obtained solution was mixed with 53 g of 1.8 wt. % aqueous solution of polyvinyl alcohol (PVA 205, Kuraray Co., Ltd.), and dispersed by a homogenizer at 15,000 rpm for 10 minutes to emulsify. The emulsion was further stirred at 40° C. for 3 hours to evaporate methyl ethyl ketone and ethyl acetate. The obtained dispersion had the solid content of 15.4 wt. %. The mean size of the fine particles was 0.30 μm.

(Formation of Image-forming Layer)

The coating solution consisting of the following components was prepared.

| Coating solution for image-forming layer | |
|---|---|
| Water | 25 g |
| The fine particle dispersion of the hydrophobic polymer | 20 g |

The coating solution for the image-forming layer was applied by a bar coater on the undercoating layer formed on the aluminum support prepared in Example 1, and dried at 60° C. for 120 seconds in an oven to form the image-forming layer having a dried weight of 1.0 $g/m^2$.

A presensitized lithographic printing plate was prepared.

(Preparation of Plat, Print and Evaluation)

The above-produced presensitized plate was imagewise exposed in an image setter (Trendsetter 3244VFS, Creo) equipped with a water-cooling semiconductor infrared laser of 40 W. The exposing conditions were the laser power of 9 V, the outer drum rotation of 210 rpm, the plate surface energy of 300 $mJ/m^2$ and the resolution of 2,400 dpi.

Without subjecting to the developing treatment, the plate was immediately installed on the cylinder of printer (HYDEL SOR-KZ). After dampening water and ink were supplied, some sheets of paper were fed and printing was performed to obtain clear prints. The plate wear was 11,000.

EXAMPLES 16 TO 20

The procedure of Example 15 was repeated except that the benzocyclobutene compound and the dienophile polymer or compound set forth in Table 3 were used in the coating solution for the image-forming layer to produce a presensitized printing plate. A printing plate was produced from the obtained presensitized plate, and then printing was carried out to evaluate the plate. The results are set forth in Table 3.

TABLE 3

| PS plate | Benzo-cyclo-butene compound | Dienophile compound, amount + dienophile polymer (weight average molecular weight) amount | Plate wear |
|---|---|---|---|
| Ex. 15 | I-1 | None + CP103 (70,000) 4.0 g | 11,000 |
| Ex. 16 | I-3 | None + CP103 (80,000) 4.0 g | 9,000 |
| Ex. 17 | I-7 | V-1, 1.0 g + CP102 (70,000) 3.0 g | 12,000 |
| Ex. 18 | I-8 | None + CP103 (70,000) 3.3 g | 11,000 |
| Ex. 19 | I-15 | None + CP102 (80,000) 3.3 g | 12,000 |
| Ex. 20 | I-29 | None + CP101 (50,000) 3.3 g | 10,000 |

EXAMPLE 21

In 60 g of ethyl acetate, 40 g of xylylene diisocyanate, 10 g of the benzocyclobutene compound (I-2), 10 g of the dienophile copolymer CP102 (weight average molecular weight: 70,000) and 0.1 g of an anionic surface active agent (BIONINE A-41C, Takemoto Yushi Co., Ltd.) were dissolved to prepare an oily phase.

Polyvinyl alcohol (PVA-117E, Kuraray Co., Ltd.) was dissolved in water in the amount of 4 wt. % to prepare an aqueous phase.

The oily phase and the aqueous phase was emulsified in a homogenizer at 10,000 rpm. To the obtained emulsion, 40 g of water was added. The mixture was stirred at the room temperature for 30 minutes, and further stirred at 40° C. for 3 hours to prepare microcapsule dispersion. The solid content of the dispersion was 20 wt. %, and the microcapsules had the average particle size of 0.40 μm.

The coating solution for the image-forming layer consisting of the following components was applied by a rod bar on the aluminum support prepared in Example 1, and dried at 70° C. for 5 minutes to form the image-forming layer having a dried weight of 0.8 g/$m^2$.

A presensitized lithographic printing plate was prepared.

| Coating solution for image-forming layer | |
|---|---|
| Microcapsule dispersion ater | 10 g |
| Infrared absorbing dye (IR-10) | 0.1 g |
| Fluorine-containing surface active agent (MEGA-FACE F-177, Dainippon Ink & Chemicals, Inc.) | 0.05 g |
| Distilled water to make up to the concentration of 7 wt. % | |

A printing plate was prepared and evaluated in the same manner as in Example 1, except that the prepared presensitized plate was used. As a result, clear prints were obtained. The plate wear was 12,000.

EXAMPLE 22

(Preparation of Aluminum Support)

Melt of JIS A1050 alloy containing Al (99.5% or more), Fe (0.30%), Si (0.10%), Ti (0.02%) and Cu (0.013%) was cleaned and molded. For cleaning the melt, the melt was degassed to remove contaminating gases such as hydrogen gas, and then filtrated through a ceramic tube filter. For molding the melt, the DC molding was carried out. The solidified molded metal was a plate having 500 mm thickness. The plate was planed off by 10 mm, and then subjected to homogenizing treatment at 550° C. for 10 hours so that the intermetallic compounds might not agglomerate. After hot rolling at 400° C., the plate was annealed at 500° C. for 60 seconds in an annealing furnace. The plate was then subjected to cold rolling to obtain an aluminum plate having 0.30 mm thickness. The surface of the rolling mill was beforehand controlled to have such roughness that the aluminum plate might have a central surface roughness (Ra) of 0.2 μm. The aluminum plate was then installed in a tension leveler.

The obtained plate was subjected to surface treatment for a lithographic printing plate.

First, the plate was subjected to oil-removing treatment with a 10 wt. % aqueous solution of sodium aluminate at 50° C. for 30 seconds to remove the rolling oil on the surface of the plate. The plate was then neutralized with a 30 wt. % aqueous solution of sulfuric acid at 50° C. for 30 seconds, and the smut was removed.

Next, for improving adhesion between the support and the image-forming layer and for increase water-holding capacity of the non-imaging area, the plate surface was subjected to roughing treatment (what is called sand roughing). In an aqueous solution containing 1 wt. % nitric acid and 0.5 wt. % aluminum nitrate at 45° C., the plate was subjected to electrolytic sand roughing treatment. In the treatment, while an aluminum web was left in the solution, an indirect power cell supplied an alternative current under the conditions of the electric current density of 20 A/$dm^2$, the duty ratio of 1:1 and the anodic electricity of 240 C/$dm^2$. After the treatment, the plate was subjected to etching treatment with a 10 wt. % aqueous solution of sodium aluminate at 50° C. for 30 seconds. The plate was then neutralized with a 30 wt. % aqueous solution of sulfuric acid at 50° C. for 30 seconds, and the smut was removed.

Further, an oxide film was formed on the support by anodic oxidation to improve abrasion resistance, chemical resistance and water-holding capacity. An indirect power cell supplied a direct current of 14 A/$dm^2$ to electrolyze for forming an oxide film of 2.5 g/$m^2$, while an aluminum web was left in a 20% aqueous solution of sulfuric acid at 35° C.

The plate was subjected to silicate treatment as a hydrophilic treatment for the non-imaging area. In the treatment, the plate was made contact with an aluminum web for 15 seconds in a 1.5% aqueous solution of sodium silicate (No. 3) at 70° C., and washed with water. The amount of attached Si was 10 mg/$m^2$. The prepared support had a surface roughness (Ra) measured along the central line of 0.25 μm (Formation of Undercoating Layer)

The following coating solution was applied in the amount of 10 g/$m^2$, and dried at 80° C. for 30 seconds on the aluminum support to form an undercoating layer.

| Coating solution for undercoating layer | |
|---|---|
| β-Alanine | 0.10 g |
| Methanol | 40 g |
| Pure water | 60 g |

(Preparation of carbon black dispersion)

The following composition was dispersed with glass beads for 10 minutes, to prepare carbon black dispersion.

Carbon black dispersion

| | |
|---|---|
| Carbon black (particle size: 0.2 to 0.3 μm) | 1.0 weight part |
| Benzyl methacrylate/methacrylic acid copolymer (molor ratio: 72/29, weight average molecular weight: 70,000) | 1.6 weight part |
| Methyl ethyl ketone | 1.6 weight part |
| 1-Methoxy-2-propanol | 3.8 weight parts |

(Formation of image-forming layer)

The coating solution consisting of the following components was prepared.

Coating solution for image-forming layer

| | |
|---|---|
| The carbon black dispersion | 2.4 g |
| 20 Wt. % methyl ethyl ketone solution of copolymer CP2 (weight average molecular weight: 30,000) | 2.2 g |
| Fluorine-containing surface active agent (MEGAFACE F-177, Dainippon Ink & Chemicals, Inc.) | 0.06 g |
| Methyl ethyl ketone | 15 g |
| 2-Methoxy-1-propanol | 12 g |

(CP2)

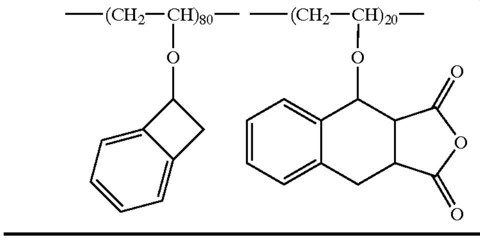

The coating solution for the image-forming layer was applied on the undercoating layer on the aluminum support, and dried at 70° C. for 5 minutes to form the image-forming layer having a dried weight of 2.0 g/$m^2$.

A presensitized lithographic printing plate was prepared.

(Preparation of Plate, Print and Evaluation)

The above-produced presensitized plate was imagewise exposed in an image setter (TRENDSETTER 3244VFS, Creo) equipped with a water-cooling semiconductor infrared laser of 40 W. The exposing conditions were the laser power of 9 V, the outer drum rotation of 210 rpm, the plate surface energy of 400 mJ/$m^2$ and the resolution of 2,400 dpi. The plate was then processed through an automatic developing machine using an alkaline developer of pH 13 and a rinsing solution. The alkaline developer was obtained by diluting a commercially available developer (DP-4 developer, Fuji Photo Film Co., Ltd.) at the diluting ratio of 1:8. The rinse solution was obtained by diluting a commercially available rinse (FR-3, Fuji Photo Film Co., Ltd.) at the diluting ratio of 1:7. Thus, a clear negative image was obtained.

The obtained lithographic printing plate was installed in a printer (HYDEL SOR-KZ), and printing was carried out to obtain a clear print. The plate wear was 12,000 sheets.

Independently, the whole obtained plate was further heated at 160° C. for 1 minute. The heated plate was installed in a printer (HYDEL SOR-KZ), and printing was carried out to obtain a clear print. The plate wear was 23,000.

EXAMPLES 23 TO 25

The procedure of Example 22 was repeated except that each polymer set forth in Table 4 was added to the coating solution for the image-forming layer as the hydrophobic polymer, to produce a presensitized printing plate. A printing plate was produced from the obtained presensitized plate, and then printing was carried out to evaluate the plate. The results are set forth in Table 4.

TABLE 4

| Presensitized lithographic printing plate | Hydrophobic polymer (weight average molecular weight) | Plate wear (number of printed sheets) |
|---|---|---|
| Example 22 | Copolymer CP2 (30,000) | 12,000 |
| Example 23 | Copolymer CP9 (28,000) | 14,000 |
| Example 24 | Copolymer CP19 (40,000) | 16,000 |
| Example 25 | Copolymer CP25 (20,000) | 13,000 |

(CP9)

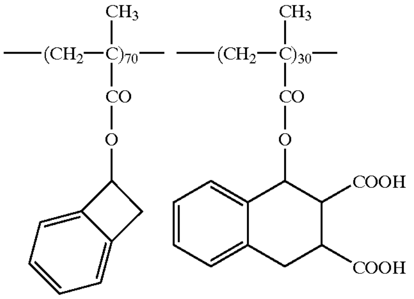

(CP19)

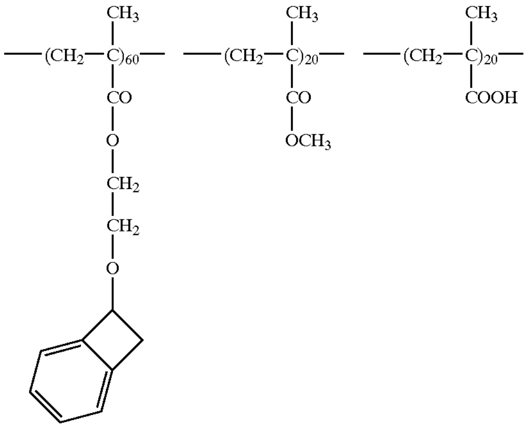

TABLE 4-continued

| Presensitized lithographic printing plate | Hydrophobic polymer (weight average molecular weight) | Plate wear (number of printed sheets) |
|---|---|---|

(CP25)

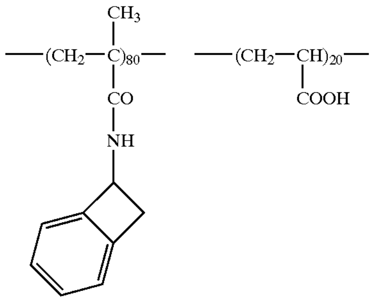

EXAMPLE 26

(Formation of Image-forming Layer)

The coating solution consisting of the following components was prepared.

| Coating solution for image-forming layer | |
|---|---|
| The carbon black dispersion used in Example 22 | 2.4 g |
| 20 Wt. % methyl ethyl ketone solution of copolymer CP2 (weight average molecular weight: 30,000) | 2.2 g |
| 4,4'-Bismaleimidediphenylmethane | 0.1 g |
| Fluorine-containing surface active agent (Megaface F-177, Dainippon Ink & Chemicals, Inc.) | 0.06 g |
| Methyl ethyl ketone | 15 g |
| 2-Methoxy-1-propanol | 12 g |

The coating solution for the image-forming layer was applied on the undercoating layer on the aluminum support prepared in Example 22, and dried at 70° C. for 5 minutes to form the image-forming layer having a dried weight of 2.0 $g/m^2$.

A presensitized lithographic printing plate was prepared.

(Preparation of Plate, Print and Evaluation)

The above-produced presensitized plate was imagewise exposed in an image setter (TRENDSETTER 3244VFS, Creo) equipped with a water-cooling semiconductor infrared laser of 40 W. The exposing conditions were the laser power of 9 V, the outer drum rotation of 210 rpm, the plate surface energy of 400 $mJ/m^2$ and the resolution of 2,400 dpi. The plate was then processed through an automatic developing machine using an alkaline developer of pH 13 and a rinsing solution. The alkaline developer was obtained by diluting a commercially available developer (DP-4 developer, Fuji Photo Film Co., Ltd.) at the diluting ratio of 1:8. The rinse solution was obtained by diluting a commercially available rinse (FR-3, Fuji Photo Film Co., Ltd.) at the diluting ratio of 1:7. Thus, a clear negative image was obtained.

The obtained lithographic printing plate was installed in a printer (Hydel SOR-KZ), and printing was carried out to obtain a clear print. The plate wear was 18,000.

EXAMPLES 27 TO 29

The procedure of Example 26 was repeated except that the hydrophobic polymer and the compound having plural dienophile structures were changed as shown in Table 5, to produce a presensitized printing plate. A printing plate was produced from the obtained presensitized plate, and then printing was carried out to evaluate the plate. The results are set forth in Table 5. Each hydrophobic copolymer in Table 5 has each corresponding weight average molecular weight shown in Table 4.

TABLE 5

| PS plate | Polymer | Compound having two or more dienophile structures | Plate wear |
|---|---|---|---|
| Ex. 26 | CP2 | 4,4'-Bismaleimidodiphenylmethane | 18,000 |
| Ex. 27 | CP9 | Pentaerythritol tetraacrylate | 20,000 |
| Ex. 28 | CP19 | Dipentaerythritol hexaacrylate | 22,000 |
| Ex. 29 | CP25 | 4,4'-Bismaleimidodiphenylmethane | 19,000 |

EXAMPLE 30

(Preparation of Hydrophobic Polymer Particle Dispersion)

In a mixture of 7.4 g of methyl ethyl ketone and 13.7 g of ethyl acetate, 6 g of a homopolymer (weight average molecular weight: 25,000) consisting of the repeating unit (II-1), 1.5 g of the infrared absorbing dye (IR-24) and 0.1 g of an anionic surface active agent (BIONINE A-41C, Takemoto Yushi Co., Ltd.) were dissolved. The obtained solution was mixed with 53 g of 1.8 wt. % aqueous solution of polyvinyl alcohol (PVA 205, Kuraray Co., Ltd.), and dispersed by a homogenizer at 15,000 rpm for 10 minutes to emulsify. The emulsion was further stirred at 40° C. for 3 hours to evaporate methyl ethyl ketone and ethyl acetate. The obtained dispersion had the solid content of 15.4 wt. %. The mean size of the fine particles was 0.30 μm.

(Formation of Image-forming Layer)

The coating solution consisting of the following components was prepared.

| Coating solution for image-forming layer | |
|---|---|
| Water | 25 g |
| The fine particle dispersion of the hydrophobic polymer | 20 g |

The coating solution for the image-forming layer was applied by a bar coater on the undercoating layer formed on the aluminum support prepared in Example 22, and dried at 60° C. for 120 seconds in an oven to form the image-forming layer having a dried weight of 1.0 g/m$^2$.

A presensitized lithographic printing plate was prepared.

(Preparation of Plat, Print and Evaluation)

The above-produced presensitized plate was imagewise exposed in an image setter (TRENDSETTER 3244VFS, Creo) equipped with a water-cooling semiconductor infrared laser of 40 W. The exposing conditions were the laser power of 9 V, the outer drum rotation of 210 rpm, the plate surface energy of 300 mJ/m$^2$ and the resolution of 2,400 dpi.

Without subjecting to the developing treatment, the plate was immediately installed on the cylinder of printer (HYDEL SOR-KZ). After dampening water and ink were supplied, some sheets of paper were fed and printing was performed to obtain clear prints. The plate wear was 11,000.

EXAMPLES 31 TO 33

The procedure of Example 30 was repeated except that each polymer set forth in Table 6 was used for the fine particles, to produce a presensitized printing plate. A printing plate was produced from the obtained presensitized plate, and then printing was carried out to evaluate the plate. The results are set forth in Table 6.

TABLE 6

| Presensitized lithographic printing plate | Hydrophobic polymer (weight average molecular weight) | Plate wear (number of printed sheets) |
|---|---|---|
| Example 30 | Homopolymer of II-1 (25,000) | 11,000 |
| Example 31 | Copolymer CP1 (45,000) | 13,000 |
| Example 32 | Homopolymer of II-5 (35,000) | 15,000 |
| Example 33 | Copolymer CP17 (40,000) | 12,000 |

(CP1)

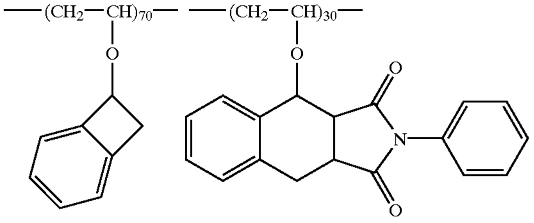

(CP17)

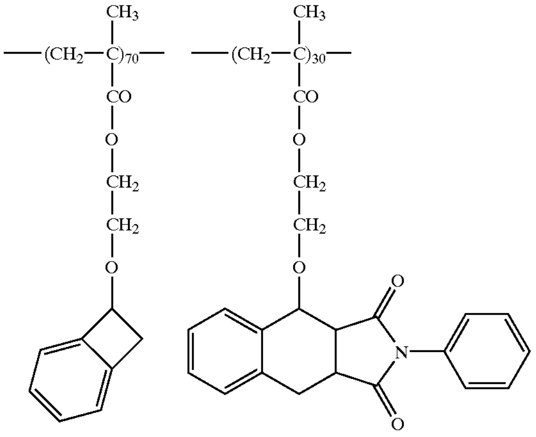

EXAMPLE 34

(Preparation of Hydrophobic Polymer Particles Dispersion)

In a mixture of 7.4 g of methyl ethyl ketone and 13.7 g of ethyl acetate, 6 g of a homopolymer (weight average molecular weight: 25,000) consisting of the repeating unit (II-1), 1.2 g of 4,4'-bismaleimidediphenylmethane, 1.5 g of an infrared absorbing dye (IR-24) and 0.1 g of the anionic surface active agent (BIONINE A-41C, Takemoto Yushi Co., Ltd.) were dissolved. The obtained solution was mixed with 53 g of 1.8 wt. % aqueous solution of polyvinyl alcohol (PVA 205, Kuraray Co., Ltd.), and dispersed by a homogenizer at 15,000 rpm for 10 minutes to emulsify. The emulsion was further stirred at 40° C. for 3 hours to evaporate methyl ethyl ketone and ethyl acetate. The obtained dispersion had the solid content of 15.4 wt. %. The mean size of the fine particles was 0.30 μm.

(Formation of Image-forming Layer)

The coating solution consisting of the following components was prepared.

| Coating solution for image-forming layer | |
|---|---|
| Water | 25 g |
| The fine particle dispersion of the hydrophobic polymer | 20 g |

The coating solution for the image-forming layer was applied by a bar coater on the undercoating layer formed on the aluminum support prepared in Example 22, and dried at 60° C. for 120 seconds in an oven to form the image-forming layer having a dried weight of 1.0 g/$m^2$.

A presensitized lithographic printing plate was produced.

(Preparation of Plate, Print and Evaluation)

The above-produced presensitized plate was imagewise exposed in an image setter (TRENDSETTER 3244VFS, Creo) equipped with a water-cooling semiconductor infrared laser of 40 W. The exposing conditions were the laser power of 9 V, the outer drum rotation of 210 rpm, the plate surface energy of 300 mJ/$m^2$ and the resolution of 2,400 dpi.

Without subjecting to the developing treatment, the plate was immediately installed on the cylinder of printer (HYDEL SOR-KZ). After dampening water and ink were supplied, some sheets of paper were fed and printing was performed to obtain clear prints. The plate wear was 20,000.

EXAMPLES 35 TO 37

The procedure of Example 34 was repeated except that the hydrophobic polymer and the compound having plural dienophile structures were changed as shown in Table 7, to produce a presensitized printing plate. A printing plate was produced from the obtained presensitized plate, and then printing was carried out to evaluate the plate. The results are set forth in Table 7. Each hydrophobic copolymer in Table 4 has each corresponding weight average molecular weight shown in Table 6.

TABLE 7

| PS plate | Polymer | Compound having two or more dienophile structures | Plate wear |
|---|---|---|---|
| Ex. 34 | II-1 | 4,4'-Bismaleimidodiphenylmethane | 20,000 |
| Ex. 35 | CP1 | Pentaerythritol tetraacrylate | 21,000 |
| Ex. 36 | II-5 | Dipentaerythritol hexaacrylate | 19,000 |
| Ex. 37 | CP17 | 4,4'-Bismaleimidodiphenylmethane | 23,000 |

EXAMPLE 38

(Formation of Image-forming Layer)

The coating solution consisting of the following components was prepared.

| Coating solution for image-forming layer | |
|---|---|
| Infrared absorbing dye (IR-25) | 0.45 g |
| Copolymer CP2 (weight average molecular weight: 30,000) | 2.5 g |
| Copolymer CP101 (weight average molecular weight: 50,000) | 2.5 g |
| Fluorine-containing surface active agent (MEGAFACE F-177, Dainippon Ink & Chemicals, Inc.) | 0.05 g |
| Methyl ethyl ketone | 24 g |
| 2-Methoxy-1-propanol | 24 g |

-continued

Coating solution for image-forming layer (CP101)

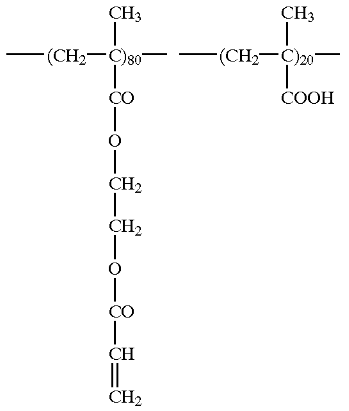

The coating solution for the image-forming layer was applied on the undercoating layer formed on the aluminum support prepared in Example 22, and dried at 70° C. for 5 minutes to form the image-forming layer having a dried weight of 1.2 g/$M^2$.

A presensitized lithographic printing plate was prepared.

(Plate Production, Print and Evaluation)

The above-produced presensitized plate was imagewise exposed, developed, used in printing and evaluated in the same manner as in Example 22, to obtain clear prints. The plate wear was 23,000.

EXAMPLES 39 TO 42

The procedure of Example 38 was repeated except that the benzocyclobutene polymer (CP2) and the dienophile polymer (CP101) were changed as shown in Table 8, to produce a presensitized printing plate. A printing plate was produced from the presensitized plate, used in printing and evaluated in the same manner as in Example 28. The results are set forth in Table 8.

TABLE 8

| PS plate | Benzocyclobutene copolymer (weight average molecular weight) | Dienophile copolymer (weight average molecular weight) | Plate wear (number of printed sheets) |
|---|---|---|---|
| Ex. 38 | CP2 (30,000) | CP101 (50,000) | 23,000 |
| Ex. 39 | CP9 (28,000) | CP102 (70,000) | 22,000 |
| Ex. 40 | CP2 (30,000) | CP104 (30,000) | 20,000 |
| Ex. 41 | CP17 (40,000) | CP101 (50,000) | 18,000 |
| Ex. 42 | CP1 (35,000) | CP106 (37,000) | 20,000 |

TABLE 8-continued

| PS plate | Benzocyclobutene copolymer (weight average molecular weight) | Dienophile co-polymer (weight average molecular weight) | Plate wear (number of printed sheets) |
|---|---|---|---|

(CP102)

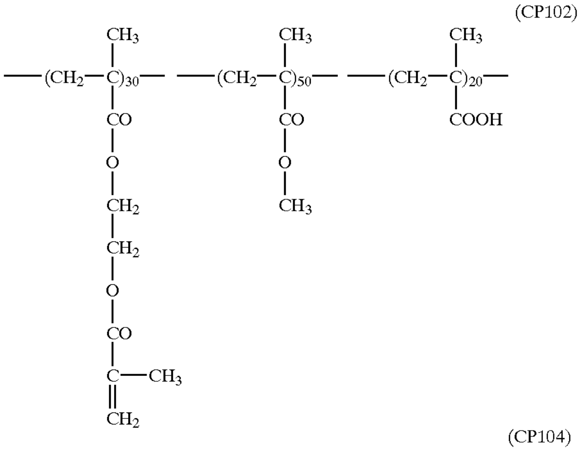

(CP104)

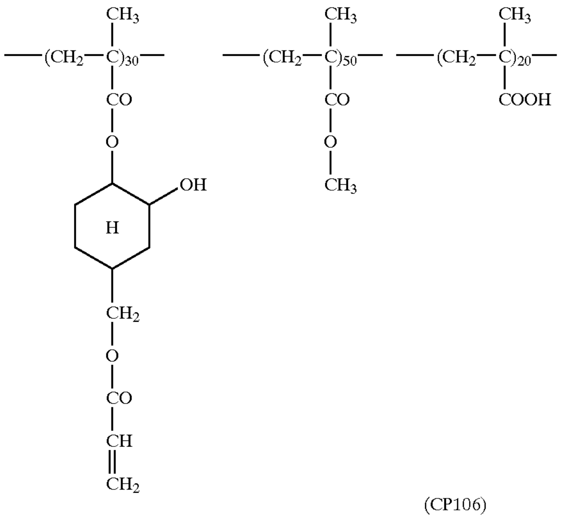

(CP106)

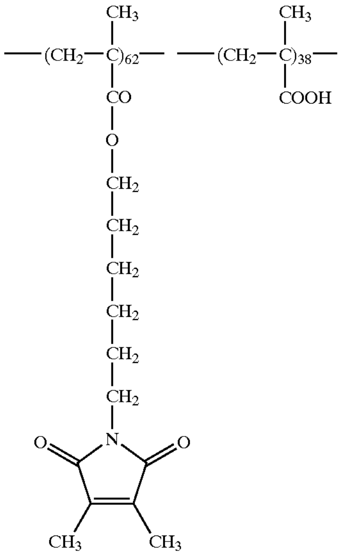

What is claimed is:

1. A lithographic process comprising the steps of: imagewise heating a presensitized lithographic printing plate which comprises a hydrophilic support and an image-forming layer containing a hydrophobic polymer and a compound having two or more o-quinodimethane structures or precursor structures thereof to polymerize the compound; and removing the unheated area of the image-forming layer to form a lithographic printing plate, wherein the image-forming layer further contains an agent capable of converting light to heat, and the presensitized lithographic printing plate is scanned with a laser beam to imagewise heat the plate.

2. The lithographic process as claimed in claim 1, wherein the compound has two or more benzocyclobutene structures as the precursor structures of the o-quinodimethane structures.

3. A lithographic process comprising the steps of: imagewise heating a presensitized lithographic printing plate which comprises a hydrophilic support and an image-forming layer containing a hydrophobic polymer and a compound having two or more o-quinodimethane structures or precursor structures thereof to polymerize the compound; and removing the unheated area of the image-forming layer to form a lithographic printing plate, wherein the image-forming layer further contains a compound having two or more dienophile structures.

4. A lithographic process comprising the steps of: imagewise heating a presensitized lithographic printing plate which comprises a hydrophilic support and an image-forming layer containing a hydrophobic polymer and a compound having two or more o-quinodimethane structures or precursor structures thereof to polymerize the compound; and removing the unheated area of the image-forming layer to form a lithographic printing plate, wherein the hydrophobic polymer has dienophile structures.

5. A lithographic process comprising the steps of: imagewise heating a presensitized lithographic printing plate which comprises a hydrophilic support and an image-forming layer containing a hydrophilic polymer and a compound having two or more o-quinodimethane structures or precursor structures thereof, said compound being contained in particles dispersed in the hydrophilic polymer to polymerize the compound and to fuse the particles together; and removing the unheated area of the image-forming layer to form a lithographic printing plate.

6. The lithographic process as claimed in claim 5, wherein the image-forming layer further contains an agent capable of converting light to heat, and the presensitized lithographic printing plate is scanned with a laser beam to imagewise heat the plate.

7. The lithographic process as claimed in claim 5, wherein the compound has two or more benzocyclobutene structures as the precursor structures of the o-quinodimethane structures.

8. The lithographic process as claimed in claim 5, wherein the image-forming layer further contains a compound having two or more dienophile structures.

9. The lithographic process as claimed in claim 5, wherein the particles further contain a hydrophobic polymer.

10. The lithographic process as claimed in claim 9, wherein the hydrophobic polymer has dienophile structures.

11. The lithographic printing process comprising the steps of: imagewise heating a presensitized lithographic printing plate which comprises a hydrophilic support and an image-forming layer containing a hydrophilic polymer and a compound having two or more o-quinodimethane structures or precursor structures thereof, said compound being contained in particles dispersed in the hydrophilic polymer to polymerize the compound and to fuse the particles together; attaching the plate to a printer; working the printer to remove the unheated area of the image-forming layer and to form a lithographic printing plate; and printing with the formed plate by supplying oily ink and dampening water to the plate.

12. A presensitized lithographic printing plate which comprises a hydrophilic support and an image-forming layer containing a hydrophilic polymer and a compound having two or more o-quinodimethane structures or precursor structures thereof, said compound being contained in particles dispersed in the hydrophilic polymer.

13. A lithographic process comprising the steps of: imagewise heating a presensitized lithographic printing plate which comprises a hydrophilic support and an image-forming layer containing a hydrophobic polymer having o-quinodimethane structures or precursor structures thereof to cross-link the hydrophobic polymer; and removing the unheated area of the image-forming layer to form a lithographic printing plate, wherein the image-forming layer further contains a hydrophilic polymer, the hydrophobic polymer is contained in particles dispersed in the hydrophilic polymer, and the hydrophobic polymer is cross-linked to fuse the particles together.

14. A lithographic process comprising the steps of: imagewise heating a presensitized lithographic printing plate which comprises a hydrophilic support and an image-forming layer containing a hydrophobic polymer having o-quinodimethane structures or precursor structures thereof to cross-link the hydrophobic polymer; and removing the unheated area of the image-forming layer to form a lithographic printing plate, wherein the image-forming layer further contains an agent capable of converting light to heat, and the presensitized lithographic printing plate is scanned with a laser beam to imagewise heat the plate.

15. The lithographic process as claimed in claim 14, wherein the hydrophobic polymer has benzocyclobutene structures as the precursor structures of the o-quinodimethane structures.

16. A lithographic process comprising the steps of: imagewise heating a presensitized lithographic printing plate which comprises a hydrophilic support and an image-forming layer containing a hydrophobic polymer having o-quinodimethane structures or precursor structures thereof to cross-link the hydrophobic polymer; and removing the unheated area of the image-forming layer to form a lithographic printing plate, wherein the image-forming layer further contains a compound having two or more dienophile structures.

17. A lithographic process comprising the steps of: imagewise heating a presensitized lithographic printing plate which comprises a hydrophilic support and an image-forming layer containing a hydrophobic polymer having o-quinodimethane structures or precursor structures thereof to cross-link the hydrophobic polymer; and removing the unheated area of the image-forming layer to form a lithographic printing plate wherein the image-forming layer further contains a polymer having dienophile structures.

18. A lithographic printing process comprising the steps of: imagewise heating a presensitized lithographic printing plate which comprises a hydrophilic support and an image-forming layer containing a hydrophilic polymer and a hydrophobic polymer having o-quinodimethane structures or precursor structures thereof, said hydrophobic polymer being contained in particles dispersed in the hydrophilic polymer to cross-link the hydrophobic polymer and to fuse the particles together; attaching the plate to a printer; working the printer to remove the unheated area of the image-forming layer and to form a lithographic printing plate; and printing with the formed plate by supplying oily ink.

19. A presensitized lithographic printing plate which comprises a hydrophilic support and an image-forming layer containing a hydrophobic polymer having o-quinodimethane structures or precursor structures thereof, wherein the image-forming layer further contains a hydrophilic polymer, and the hydrophobic polymer is contained in particles dispersed in the hydrophilic polymer.

* * * * *